United States Patent
Boyle et al.

(10) Patent No.: US 7,644,385 B1
(45) Date of Patent: Jan. 5, 2010

(54) PROGRAMMABLE LOGIC DEVICE WITH PERFORMANCE VARIATION COMPENSATION

(75) Inventors: Peter Boyle, Santa Clara, CA (US); Iliya Zamek, Santa Clara, CA (US)

(73) Assignee: Altera Corporation, San Jose, CA (US)

( * ) Notice: Subject to any disclaimer, the term of this patent is extended or adjusted under 35 U.S.C. 154(b) by 513 days.

(21) Appl. No.: 11/269,019

(22) Filed: Nov. 7, 2005

(51) Int. Cl.
   *H03K 17/693* (2006.01)

(52) U.S. Cl. .................... 716/16; 716/6; 716/4; 326/38

(58) Field of Classification Search ............. 326/38–41; 716/16, 17
   See application file for complete search history.

(56) References Cited

U.S. PATENT DOCUMENTS

| | | | |
|---|---|---|---|
| 5,028,824 A | | 7/1991 | Young |
| 5,430,734 A | * | 7/1995 | Gilson ........................ 714/725 |
| 5,925,920 A | | 7/1999 | MacArthur et al. |
| 6,107,820 A | | 8/2000 | Jefferson et al. |
| 6,111,428 A | | 8/2000 | Hanatani |
| 6,373,779 B1 | | 4/2002 | Pang et al. |
| 6,661,712 B2 | | 12/2003 | Hiraki et al. |
| 6,812,516 B2 | | 11/2004 | Noble et al. |
| 6,930,935 B2 | | 8/2005 | Nanba et al. |
| 7,143,295 B1 | * | 11/2006 | Trimberger ................. 713/189 |
| 7,162,644 B1 | * | 1/2007 | Trimberger ................. 713/189 |
| 7,200,235 B1 | * | 4/2007 | Trimberger ................. 380/277 |
| 7,278,128 B1 | * | 10/2007 | Trimberger ................. 716/17 |
| 7,310,758 B1 | * | 12/2007 | Cossoul et al. .............. 714/725 |
| 7,343,578 B1 | * | 3/2008 | Patterson et al. .............. 716/16 |
| 7,366,306 B1 | * | 4/2008 | Trimberger ................. 380/278 |
| 7,406,673 B1 | * | 7/2008 | Patterson et al. .............. 716/16 |
| 7,506,296 B1 | * | 3/2009 | Parpia et al. .................. 716/16 |

* cited by examiner

*Primary Examiner*—Vibol Tan
(74) *Attorney, Agent, or Firm*—Treyz Law Group; G. Victor Treyz

(57) ABSTRACT

Methods and apparatus for designing and producing programmable logic devices are provided. A logic design system may be used to produce configuration data containing alternative configuration memory settings each of which is optimized for programmable logic devices with different performance characteristics. During manufacturing, programmable logic devices are tested to identify their performance characteristics. A bin code is stored in non-volatile memory in each device to specify which performance characteristics are associated with that device. During programming, the bin code of a given device is used to decide which of the alternative configuration memory settings are to be discarded. The retained subset of the configuration data is loaded into configuration memory in the given device.

12 Claims, 19 Drawing Sheets

| | $t_1$ | $t_2$ | $t_3$ | $t_4$ | $t_{total}$ | $t_0$ | $\Delta t$ |
|---|---|---|---|---|---|---|---|
| TYPICAL | 50ps | 50ps | 50ps | 50ps | 200ps | 200ps | 0 |
| FAST | 40ps | 40ps | 40ps | 40ps | 160ps | 200ps | +40ps |
| SLOW | 60ps | 60ps | 60ps | 60ps | 240ps | 200ps | -40ps |

(PRIOR ART)

FIG. 5

| | $t_1$ | $t_2$ | $t_3$ | $t_4$ | $t_{total}$ | BIN CODE | CONFIG. MEM. SETTING | $t_0$ | $\Delta t$ |
|---|---|---|---|---|---|---|---|---|---|
| TYPICAL | 50ps | 50ps | 50ps | 50ps | 200ps | 00 | 01 | 200ps | 0 |
| FAST | 40ps | 40ps | 40ps | 40ps | 160ps | 01 | 10 | 160ps | 0 |
| SLOW | 60ps | 60ps | 60ps | 60ps | 240ps | 10 | 00 | 240ps | 0 |

FIG. 6

| BIN CODE | $I_{SAT}$ | CM= 00 | CM= 01 | CM= 10 | CM= 11 |
|---|---|---|---|---|---|
| 00 | 6mA | 14mA | 12mA | 8mA | 6mA |
| 01 | 7mA | 16mA | 14mA | 10mA | 8mA |
| 10 | 8mA | 18mA | 16mA | 14mA | 10mA |

FIG. 12

PROGRAMMABLE LOGIC DEVICE WITH PERFORMANCE VARIATION COMPENSATION

BACKGROUND

This invention relates to programmable logic devices, and more particularly, to taking into account manufacturing variations to minimize programmable logic device performance variations.

Programmable logic devices are a type of integrated circuit that can be programmed by a user to implement a desired custom logic function. In a typical scenario, a logic designer uses computer-aided design (CAD) tools to design a custom logic circuit. The CAD tools help the designer implement the custom logic circuit using available programmable logic device resources. The CAD tools generate configuration data. When the configuration data is loaded into a programmable logic device, the programmable logic device performs the functions of the custom logic circuit.

Due to variations in manufacturing processes, individual programmable logic devices of the same type do not perform identically. For example, some devices may operate reliably at faster speeds than other devices. Sometimes manufacturers sell parts that perform differently as different parts. With this type of approach, fast parts might, as an example, have a different model designation than slow parts and might be sold at a premium price relative to slow parts.

There is a practical limit to this type of product differentiation for complex integrated circuits. There are many possible manufacturing variations that may affect circuit performance, but not each variation warrants the introduction of an entirely new product. As a result, there is a range of acceptable performance variations for each product. To ensure adequate manufacturing yield, the range of acceptable performance variations that is tolerated for a product is often sizable.

Programmable logic device manufacturers publish performance specifications for their products to make logic designers aware of what type of performance variations are to be expected for each product. A logic designer can consult these specifications when designing a custom circuit to ensure that the circuit will perform satisfactorily when implemented in the programmable logic device.

The size of the performance variations listed in a manufacturer's published performance specifications serve as a figure of merit. Devices with narrow tolerances are more valuable to logic designers than devices with wide tolerances, because narrow tolerances allow circuit designers to design circuits aggressively. When designing circuits for programmable logic devices with poor tolerances, a logic designer is forced to be conservative, which adversely affects performance.

What is therefore needed is a way to effectively compensate programmable logic devices for performance variations arising from manufacturing variations.

SUMMARY

Variations in programmable logic device performance can be addressed by characterizing programmable logic devices during manufacturing. Devices can be categorized based on their performance characteristics. For example, devices that exhibit short delay times may be allocated to a bin of fast devices, whereas devices that exhibit long delay times may be allocated to a bin of slow devices. Devices may be tagged with a bin code based on their measured characteristics. The bin code for each device may be stored in a non-volatile memory in the device.

Computer-aided-design tools create configuration data files for implementing a logic designer's desired logic design. The configuration data that is produced may contain bin-code-specific alternative configuration memory settings. For example, the configuration data can contain one alternative configuration memory setting that sets the delay time of a variable delay element to an optimum setting for fast bin code devices and another alternative configuration memory setting that sets that delay time of the variable delay element to an optimum setting for slow bin code devices.

During programming of a given programmable logic device, the configuration data is filtered based on the bin code of the given device. The filtered data is a subset of the original configuration data. If, for example, the bin code indicates that the device being programmed is a fast device, the alternative configuration memory setting that is appropriate for fast devices is included in the subset. The subset of the configuration data is loaded into configuration memory in the given programmable logic device, programming the device so that it is optimized for its individual performance characteristics.

Further features of the invention, its nature and various advantages will be more apparent from the accompanying drawings and the following detailed description of the preferred embodiments.

BRIEF DESCRIPTION OF THE DRAWINGS

FIG. 5 is a table presenting an example of the types of performance tolerances that can arise when manufacturing conventional programmable logic devices.

FIG. 6 is a table showing how improved programmable logic device performance tolerances may be achieved by taking into account performance variations due to manufacturing variations when programming programmable logic devices in accordance with the present invention.

FIG. 12 is an illustrative table relating bin codes, configuration memory settings, and performance data for a programmable logic device in accordance with the present invention.

DETAILED DESCRIPTION

The present invention relates to integrated circuits that have circuitry that can be programmed by a user. Circuits of this type are typically referred to as programmable logic device integrated circuits. The invention also relates to arrangements for making test measurements to characterize programmable logic devices, manufacturing programmable logic devices, and programming programmable logic devices.

Programmable logic devices are integrated circuits that can be configured by a user (e.g., a logic designer) to perform custom logic functions. Electrically-programmed programmable logic devices are programmed by loading configuration data into the device. The configuration data selectively turns on and off components of the device's circuitry and thereby customizes the logic on the device.

Figure 1:
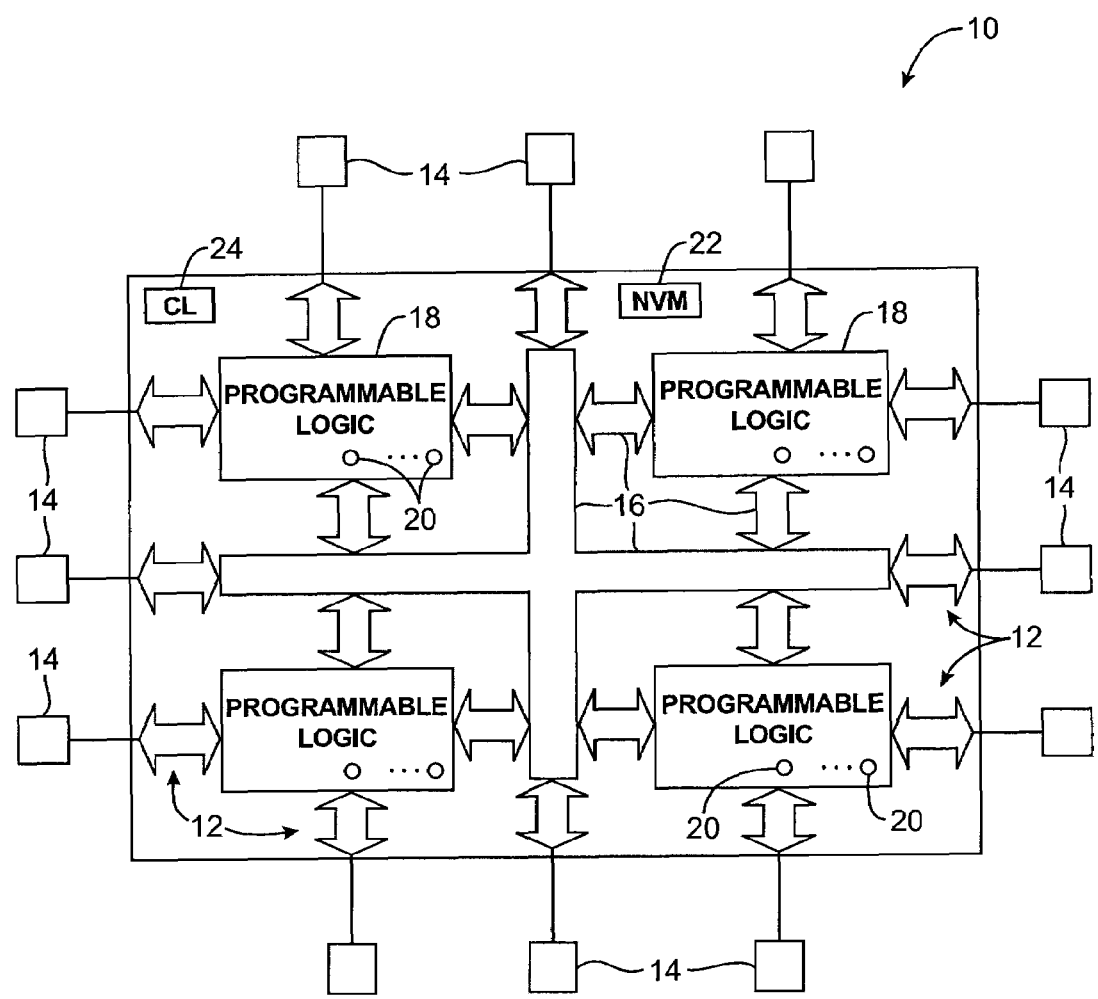
FIG. 1 is a diagram of an illustrative programmable logic device in accordance with the present invention.

An illustrative programmable logic device 10 in accordance with the present invention is shown in FIG. 1.

Programmable logic device 10 has input/output circuitry 12 for driving signals off of device 10 and for receiving signals from other devices via input/output pins 14. Pins 14 may be any suitable types of pins or solder bumps for making electrical connections between the internal circuitry of device 10 and external packaging. Some of the pins 14 may be used for high-speed communications signals, other pins may be used to provide power supply voltages to the device 10 or may be used for DC or low-frequency signals.

Interconnection resources 16 such as global and local vertical and horizontal conductive lines and busses may be used to route signals on device 10. Other circuitry 18 on device 10 includes blocks of programmable logic, memory blocks, regions of digital signal processing circuitry, processors, etc. The programmable logic in circuitry 18 may include combinational and sequential logic circuitry including logic gates, multiplexers, switches, memory blocks, look-up-tables, logic arrays, etc. These illustrative components are not mutually exclusive. For example, look-up tables and other components that include logic gates and switching circuitry can be formed using multiplexers.

Some of the logic of programmable logic device 10 is fixed (hardwired). The programmable logic in device 10 also includes components that may be configured so that device 10 performs a desired custom logic function. The programmable logic in programmable logic device 10 may be based on any suitable programmable technology. With one suitable approach, configuration data may be loaded into programmable elements. The collection of programmable elements is often referred to as configuration memory. The configuration data, which is sometimes referred to as programming data, is loaded into the configuration memory in the programmable logic device 10 using pins 14 and input/output circuitry 12. During normal operation of device 10 in a finished system, the programmable elements in the configuration memory each provide a static control output signal that controls the state of an associated logic component in the programmable logic of circuitry 18.

In a typical arrangement, the programmable elements may be random-access memory (RAM) cells that are loaded from an external chip via certain pins 14 and appropriate portions of input/output circuitry 12. The loaded RAM cells provide static control signals that are applied to the terminals (e.g., the gates) of circuit elements (e.g., metal-oxide-semiconductor transistors) in the programmable logic of circuitry 18 to control those elements (e.g., to turn certain transistors on or off) and thereby configure programmable logic device 10. Circuit elements in input/output circuitry 12 and interconnection resources 16 are also generally configured by the RAM cell outputs as part of the programming process (e.g., to customize I/O and routing functions). The circuit elements that are configured in input/output circuitry 12, interconnection resources 16, and circuitry 18 may be transistors such as pass transistors or parts of multiplexers, look-up tables, logic arrays, AND, OR, NAND, and NOR logic gates, etc.

RAM-based programmable logic device technology is merely one illustrative example of the type of technology that may be used to implement programmable logic device 10. Other suitable programmable logic device technologies that may be used for device 10 include one-time programmable device arrangements such as those based on programmable logic elements made from fuses or antifuses, programmable logic devices in which elements 34 are formed from electrically-programmable read-only-memory (EPROM) or erasable-electrically-programmable read-only-memory (EEPROM) technology, or programmable logic devices with programmable elements made from magnetic storage elements, etc. Illustrative programmable logic elements are shown schematically as elements 20 in FIG. 1.

Regardless of the particular type of programmable element arrangement that is used for the configuration memory of device 10, the configuration memory is preferably provided with configuration data by a user (e.g., a logic designer). Once provided with configuration data, the programmable elements in the configuration memory selectively control (e.g., turn on and off) portions of the circuitry in the programmable logic device 10 and thereby customize its functions so that it will operate as desired.

The circuitry of device 10 may be organized using any suitable architecture. As an example, the logic of programmable logic device 10 may be organized in a series of rows and columns of larger programmable logic regions or areas each of which contains multiple smaller logic regions or areas (e.g., areas of logic based on look-up tables or macrocells). These logic resources may be interconnected by interconnection resources 16 such as associated vertical and horizontal interconnection conductors. Interconnection conductors may include global conductive lines that span substantially all of device 10, fractional lines such as half-lines or quarter lines that span part of device 10, staggered lines of a particular length (e.g., sufficient to interconnect several logic areas), smaller local lines that interconnect small logic regions in a given portion of device 10, or any other suitable interconnection resource arrangement. If desired, the logic of device 10 may be arranged in more hierarchical levels or layers in which multiple large areas are interconnected to form still larger portions of logic. Still other device arrangements may use logic that is not arranged in rows and columns. Portions of device 10 (e.g., in input/output circuitry 12 and elsewhere) may be hardwired for efficiency. As an example, hardwired transmitter and receiver circuitry may be used to assist with high-speed serial communications functions. Hardwired digital signal processing circuitry (e.g., multipliers, adders, etc.) may also be used.

Programmable logic device 10 contains non-volatile memory 22 and configuration logic 24. Non-volatile memory 22 is used to store information on the programmable logic device 10 such as information on what type of performance characteristics are associated with the programmable logic device. This information may be stored in the form of a code (as an example). During programming, configuration logic 24 uses the code in non-volatile memory 22 to select which configuration data is loaded into device 10. Because each programmable logic device 10 is programmed to reflect the particular performance characteristics of that device, performance variations between devices are minimized without any need to improve underlying manufacturing process tolerances. This allows the programmable logic device manufacturer to improve published device specifications.

Modern semiconductor fabrication techniques of the type that are used to produce programmable logic device integrated circuits involve numerous individual process steps, such as material deposition, etching, polishing, oxidation, doping, annealing, patterning, etc. Normal variations in performing these steps lead to variations in the finished components on an integrated circuit. For example, the polysilicon gate regions on transistors on the integrated circuits may have widths that are larger or smaller than their expected nominal values. Oxide thicknesses may be smaller or larger than expected and doping concentrations may vary. These variations lead to variations in device characteristics. For example, the threshold voltages of n-channel and p-channel metal-oxide-semiconductor transistors may be larger or smaller than nominal values, various resistances and capacitances may be larger or smaller than expected, etc.

Variations in the components on a programmable logic device integrated circuit affect circuit performance. For example, devices such as transistors may switch faster or slower than expected, leading to unexpectedly short or long delays as signals traverse paths on the integrated circuit. Transistor saturation currents may be larger or smaller than nominal values, leading to variations in circuit performance such as buffer drive currents that are smaller or larger than expected or voltage supply levels that are smaller or larger than nominal values.

Because processing variations lead to undesirable variations in circuit performance, considerable efforts are made to ensure that manufacturing processes are well controlled. There are practical limits, however, to how much processes can be controlled. If too much weight is placed on reducing process variations, yields will suffer. For a process to be economically viable, some process variations must be accepted.

With the present invention, each programmable logic device integrated circuit that is manufactured is tested to determine its performance characteristics (i.e., slow, fast, low or high currents, low or high voltages, etc.). Following testing, each circuit is labeled accordingly. With one suitable approach, programmable logic device integrated circuits are grouped in bins. Each bin of devices has similar performance characteristics. After each circuit has been tested to determine its bin, the circuit is labeled by storing a corresponding bin code in non-volatile memory 22.

When the logic designer's logic design is being processed, configuration data is produced that includes alternative configuration memory settings. Each alternative configuration memory setting is optimized for implementing the logic design in a respective bin. During programming, configuration logic 24 uses the bin code stored in the non-volatile memory 22 to select the appropriate configuration memory setting. The configuration data including the appropriate alternative configuration memory setting is loaded into the configuration memory 20 to program device 10.

Consider, as an example, the situation in which a logic designer desires to accurately control the relative timing between a clock signal and a data signal. A logic designer may desire to control the timing between a clock and data signal to ensure that there is adequate settling time when the data signal is received and processed by a register or other circuit.

Figure 2:
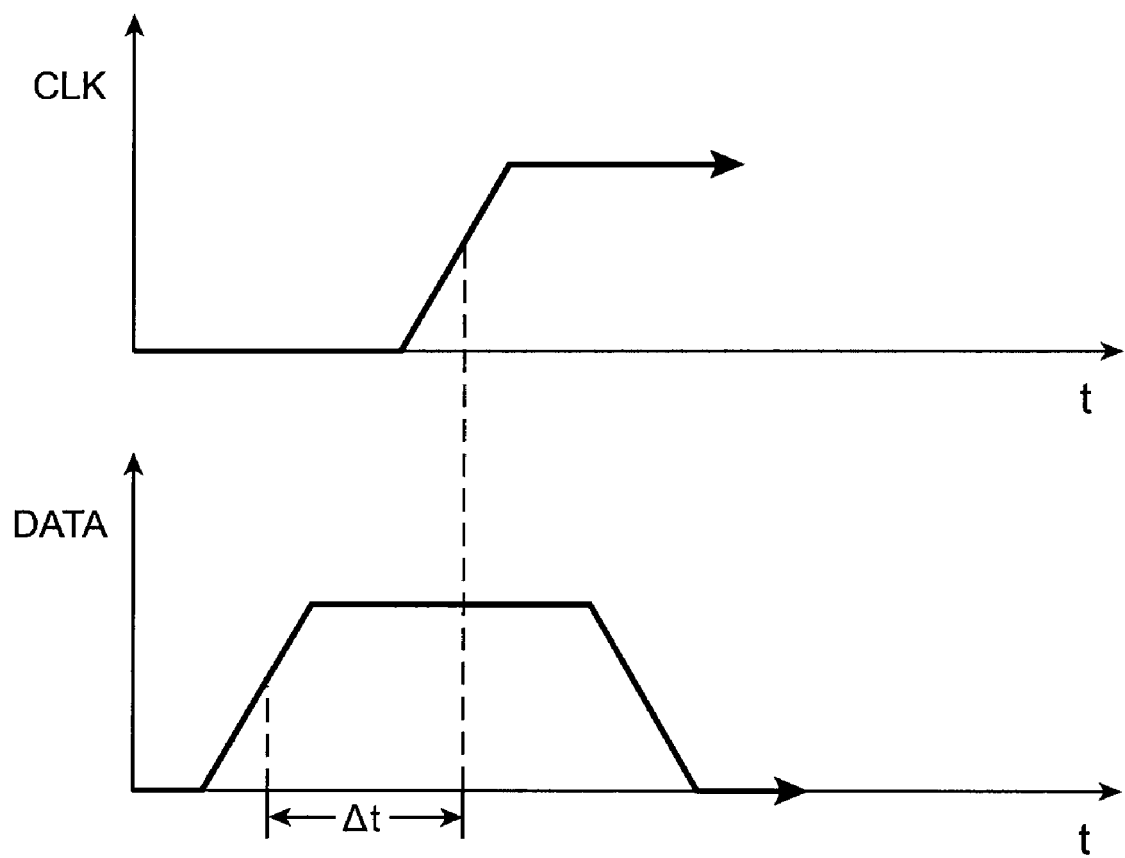
FIG. 2 is a graph showing the relative timing of illustrative clock and data signals on a programmable logic device in accordance with the present invention.

An illustrative clock signal CLK and data signal DATA are shown in FIG. 2. As shown in the upper trace of FIG. 2, clock signal CLK has a leading edge that rises at time $t_{clk}$. As shown in the lower trace of FIG. 2, data signal DATA has a leading edge that rises at time $t_{data}$. The DATA signal is leading the CLK signal by a time $\Delta t = |t_{data} - t_{clk}|$.

Figure 3:
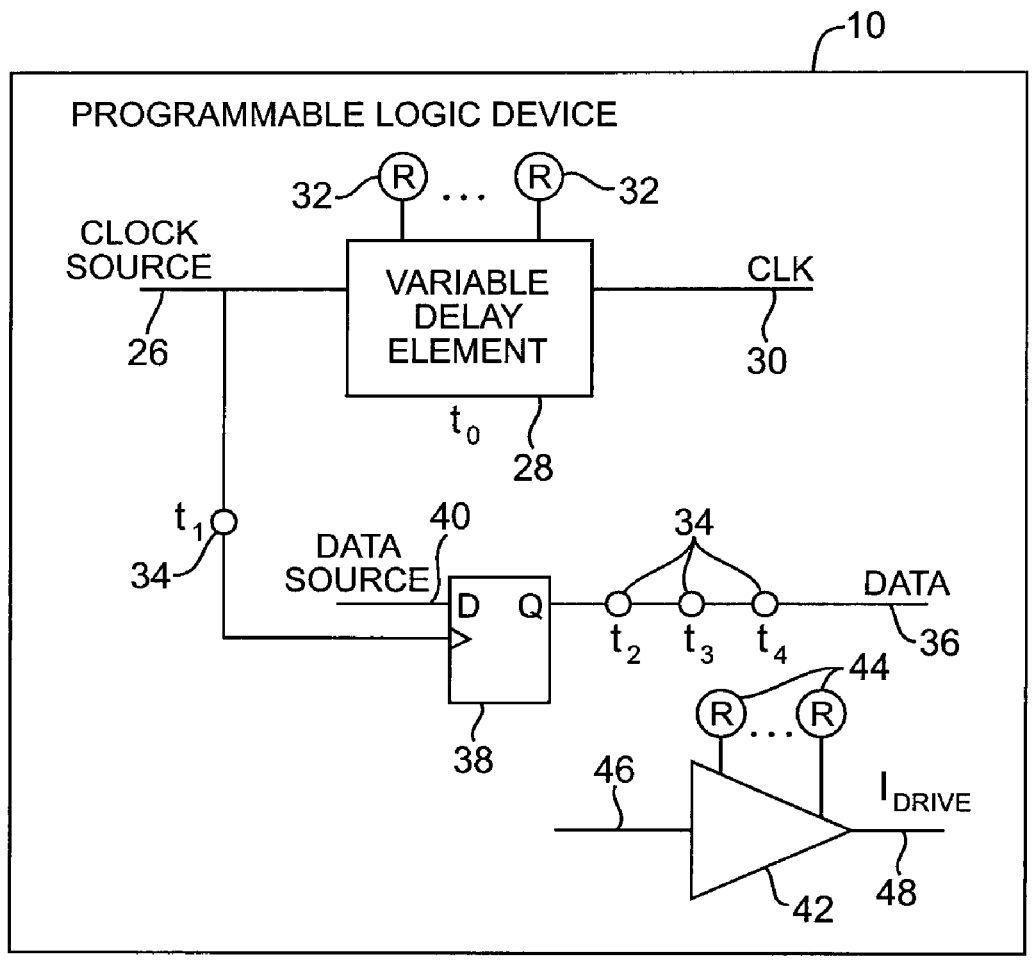
FIG. 3 is a diagram of an illustrative programmable logic device in which programmable elements are programmed to adjust performance characteristics such as delay times and drive currents in accordance with the present invention.

An illustrative programmable logic device integrated circuit 10 that contains a circuit with a CLK and DATA signal is shown in FIG. 3. In the example of FIG. 3, clock signals are provided on a clock source line 26. The clock signals are used as a clock input to register 38. The clock signals are also distributed throughout device 10. In a typical scenario, there are numerous clock trees in a programmable logic device 10. In the example of FIG. 3, the clock from clock source line 26 is distributed to clock line 30 via variable delay element 28. The variable delay element 28 produces a controllable amount of delay $\tau_D$ based on the values of the configuration data bits loaded into configuration memory 32.

Figure 4:
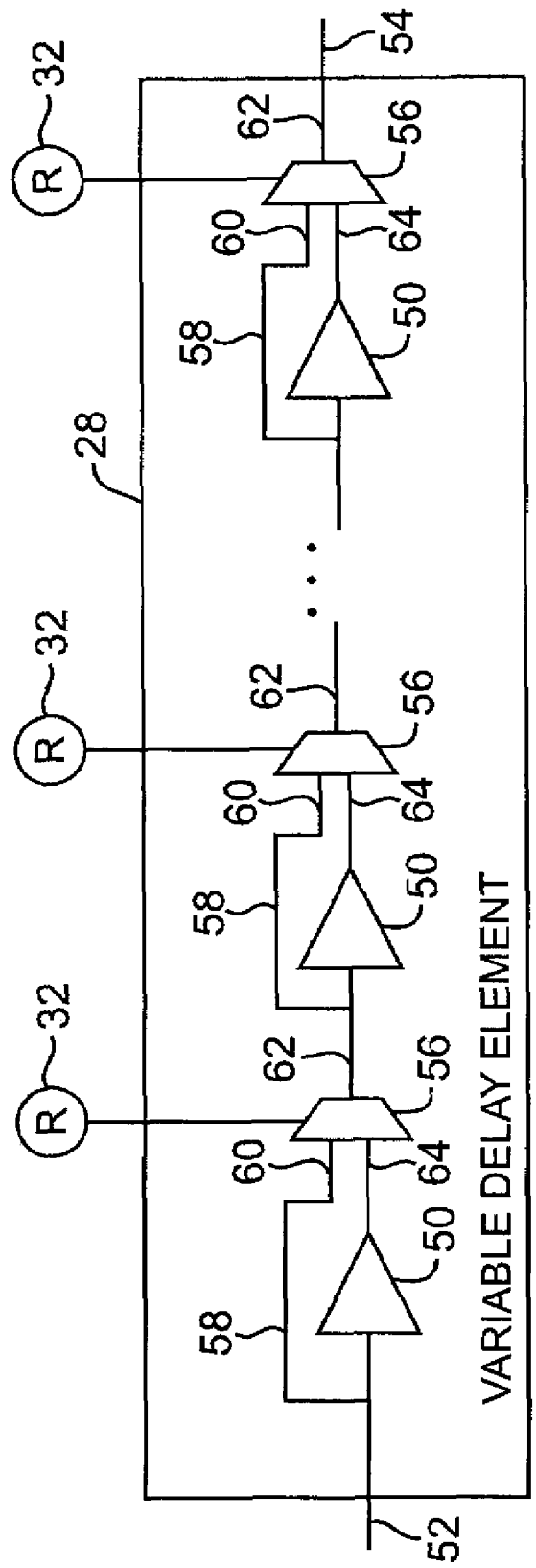
FIG. 4 is a diagram of an illustrative variable delay element that may be adjusted to produce a desired amount of delay on a programmable logic device integrated circuit constructed in accordance with the present invention.

An illustrative variable delay element 28 is shown in FIG. 4. As shown in the schematic of FIG. 4, variable delay element 28 has an input 52 and an output 54. A signal applied to the input 52 passes through a number of buffers 50, each of which contributes a delay to the signal. Bypass lines 58 may be used to selectively bypass some or all of the buffers 50. Multiplexers 56 each have two inputs and an output. The values of the bits in configuration memory elements 32 control the states of multiplexers 56. If, for example, the configuration data in one of elements 32 is high, the multiplexer controlled by that element will connect its bypass path input 60 to its output 62. If, however, the configuration data in the element 32 is low, the multiplexer will connect its buffer-delayed input 64 to its output 62. By controlling how many buffers 50 are included in the signal path between input 52 and output 54, the variable delay element 28 produces a controllable amount of delay $\tau_D$.

As shown in FIG. 3, data from data source line 40 may pass through logic circuits such as flip-flop 38 before being provided to data signal line 36. Elements such as interconnect connections, buffers, routing lines, and other circuit components each contribute delay. In the simplified example of FIG. 3, the only delay experienced by the signal CLK on line 30 is the delay $\tau_D$ produced by variable delay element 28. The DATA signal on line 36 experiences delay contributions from elements 34. For example, the clock from line 26 is delayed by a time $t_1$ by the element 34 that lies in the path between clock source line 26 and the clock input of flip-flop 38. The elements 34 between the data (Q) output of flip-flop 38 and line 36 contribute respective delays of $t_2$, $t_3$, and $t_4$. Because the delays in this type of arrangement are additive, the relative delay between the signals CLK and DATA is $\Delta t = \tau_D - t_1 + t_2 + t_3 + t_4$.

Often, the relative timing between signals on a circuit such as CLK and DATA will be critical. For example, if these signals feed into a logic circuit where the signal CLK is used to clock the signal DATA, it may be critical for the logic designer to ensure that settling time constraints and other timing constraints are observed. Unless the logic designer is conservative and provides sufficient timing margins in the design of a circuit, the circuit may not function properly.

The impact of performance variations resulting from a conventionally-manufactured programmable logic device integrated circuit are shown in the table of FIG. 5. In the illustrative scenario of FIG. 5, a programmable logic device of the type shown in FIG. 3 has been manufactured using conventional semiconductor manufacturing processes. Due to conventional semiconductor fabrication variations, the programmable logic device integrated circuits that are produced do not all have the same performance. In particular, some of the devices (called "typical" in FIG. 5) have delays times $t_1 = t_2 = t_3 = t_4$ of 50 ps each, resulting in a total delay time $t_{total} = t_1 + t_2 + t_3 + t_4$ of 200 ps. Other devices (called "fast" in FIG. 5) have delays times $t_1 = t_2 = t_3 = t_4$ of 40 ps each, resulting in a total delay time $t_{total} = t_1 + t_2 + t_3 + t_4$ of 160 ps. The slowest group of programmable logic devices is called "slow". Devices in this group have delays times $t_1 = t_2 = t_3 = t_4$ of 60 ps each, resulting in a total delay time $t_{total} = t_1 + t_2 + t_3 + t_4$ of 240 ps. The manufacturer in this simplified example publishes a performance specification in which the value of $t_{total}$ is said to be 200 ps+/−40 ps.

A logic designer who is planning on implementing a logic design in a programmable logic device having a manufacturing distribution of the type shown in the table of FIG. 5, must take into account the range of possible delays associated with the typical, fast, and slow devices. Consider, as an example, the situation in which the desired relative time delay $\Delta t$ between the signals CLK and DATA is 0. Consulting the published device specifications, the logic designer creates a logic design in which the delay $\tau_D$ is set to 200 ps. In typical devices, the delay $\tau_D$ will equal $t_{total}$, so $\Delta t$ is 0 as desired. In fast and slow devices, however, this value of $\tau_D$ is not optimal. In fast devices, the $\tau_D$ value of 200 ps is too large, so the signal CLK is 40 ps behind the signal DATA, as shown by the $\Delta t$ value of 40 ps in the second row of the table of FIG. 5. In slow devices, the $\tau_D$ value of 200 ps is too small, so in slow devices $\Delta t$ is −40 ps.

Because of the range of $t_{total}$ values exhibited by the programmable logic device, the logic designer must create a conservative logic design. The logic design must include sufficient timing margins to ensure that the resulting circuit will operate properly under all possible conditions. The design must operate properly not only when implemented on devices in which $\Delta t$ is 0, but on devices in which $\Delta t$ is within +/−40 ps of 0 (i.e., on the slow and fast devices).

With the present invention, devices with different performance characteristics can be identified by their bin code, so the value of $\tau_D$ can be set differently for different devices. An example of this type of arrangement is shown in the table of FIG. 6. In the example of FIG. 6, a programmable logic device of the type shown in FIG. 3 has been manufactured using a semiconductor manufacturing processes in accordance with the present invention. Due to conventional semiconductor fabrication variations, the programmable logic device integrated circuits that are produced have a range of performances. As in the example of FIG. 5, typical devices have $t_{total}$ values of 200 ps, fast devices have $t_{total}$ values of 160 ps, and slow devices have $t_{total}$ values of 240 ps.

During manufacturing, fabricated devices can be tested to determine whether they belong in the typical, fast, or slow category. Typical devices are assigned a bin code of 00 and this value is stored in non-volatile memory 22. In fast devices, a bin code of 01 is stored in non-volatile memory 22. Slow devices receive a bin code of 10. In this example, the bin codes are binary two-bit numbers. In general, any suitable type of code or data indicative of the performance characteristics of the device may be stored in non-volatile memory (e.g., three-bit numbers, four-bit numbers, numbers greater than four bits in size, etc.)

During programming, the configuration logic 24 on a programmable logic device in accordance with the invention accesses the bin code information stored in non-volatile memory 22. Using this information, the configuration logic 24 can decide which configuration data should be loaded into the configuration memory of device 10. If, as an example, the configuration logic 24 determines that the programmable logic device in which the configuration logic 24 is contained is of the fast variety, the configuration logic 24 loads configuration data into the configuration memory that sets the delay time $\tau_D$ of variable delay element 28 to 160 ps. In devices with typical delay times, configuration data is loaded that sets the delay time $\tau_D$ to 200 ps. In slow devices, the loaded configuration data sets $\tau_D$ to 240 ps.

Any suitable scheme may be used to ensure that the proper configuration data is loaded into the configuration memory. For example, an external configuration device may obtain the bin code from the non-volatile memory and may adjust the configuration data that is loaded into the configuration memory of the programmable logic device. Preferably, the configuration data includes alternative configuration memory settings that are provided to the configuration logic as part of the configuration data file. The configuration logic uses the bin code data to determine which of the alternative memory settings to retain.

In the example of FIG. 6, three alternative configuration memory settings that are included in the configuration data (01), (10), and (00). These memory settings represent configuration bits that are loaded into programmable elements such as elements 32 of FIGS. 3 and 4. When the pattern 01 is loaded into elements 32 (in this example), the variable delay element 28 produces a time delay $\tau_D$ of 200 ps. When the configuration memory setting of 10 is loaded into elements 32 in the configuration memory, the variable delay element 28 is instructed to produce a time delay $\tau_D$ of 160 ps. When a memory setting of 00 is loaded, delay element 28 produces a delay $\tau_D$ of 240 ps.

During programming, the configuration logic 24 (or other suitable circuitry) detects the value of the bin code in the programmable logic device that is being programmed. Using the bin code, the configuration logic decides which of the three alternative configuration memory settings is to be loaded into the configuration memory. As shown in the table of FIG. 6, a configuration memory setting of 01 is used when the configuration logic detects a bin code of 00. If the bin code is 01, a configuration memory setting of 10 is used. A configuration memory setting of 00 is used in programming the device if the device has been tagged with a bin code of 10.

With this type of approach, the variable delay element 28 is adjusted as needed to compensate for the various values of $t_{total}$ that are exhibited by the typical, fast, and slow versions of the programmable logic device. When the expected delay $t_{total}$ is high, the delay $\tau_D$ is set high and when the expected delay $t_{total}$ is low, the delay $\tau_D$ is set low. The relative timing Δt between CLK and DATA is therefore always 0 s, as shown in the final column of the table of FIG. 6. The use of the bin codes to label the fast, slow, and typical devices and the adjustment of the programmable circuitry in the fast, slow, and typical devices to compensate for variations arising from semiconductor fabrication process variations therefore results in improved performance specifications. In particular, the range of Δt values exhibited by the programmable logic devices is narrow (i.e., Δt can be maintained at 0 s+/−0 s, rather than +/−40 ps as with the conventional arrangement described in connection with FIG. 5).

The narrow range of performance variations that is achieved using the present invention can be published by the programmable logic device manufacturer and can be relied upon by a logic designer. In the present example, the relative timing between CLK and DATA is assured of remaining within +/−0 s, rather than +/−40 ps, so the logic designer need not be as conservative in designing a logic circuit. The 80 ps of timing uncertainty that was present in the conventional arrangement has been eliminated, so the designer can be more aggressive by and can eliminate 80 ps of timing margin from the design. This allows the logic designer to design logic circuits with improved performance.

In the examples of FIGS. 5 and 6, the performance characteristic that was considered was timing delay. In general, the present invention may be used to compensate for variations in any suitable performance characteristic due to semiconductor fabrication variations. For example, bin codes may be used to identify programmable logic devices with tendencies for producing low or high currents. As shown in FIG. 3, a programmable logic device 10 may include one or more buffers 42. A buffer 42 may produce data signals at an output line 48 in response to data input signals applied to an input line 46. A drive current $I_{DRIVE}$ is associated with the output on line 48. With one suitable arrangement, the value of $I_{DRIVE}$ can be controlled by adjusting the configuration memory settings loaded into configuration memory 44. When a programmable logic device integrated circuit 10 having a buffer 42 of the type shown in FIG. 3 is manufactured using the techniques of the present invention, a bin code is stored in the device that identifies whether the device has a typical, high, or low level of $I_{DRIVE}$. During programming, appropriate configuration memory settings are used to adjust $I_{DRIVE}$ to an appropriate level.

Figure 7:
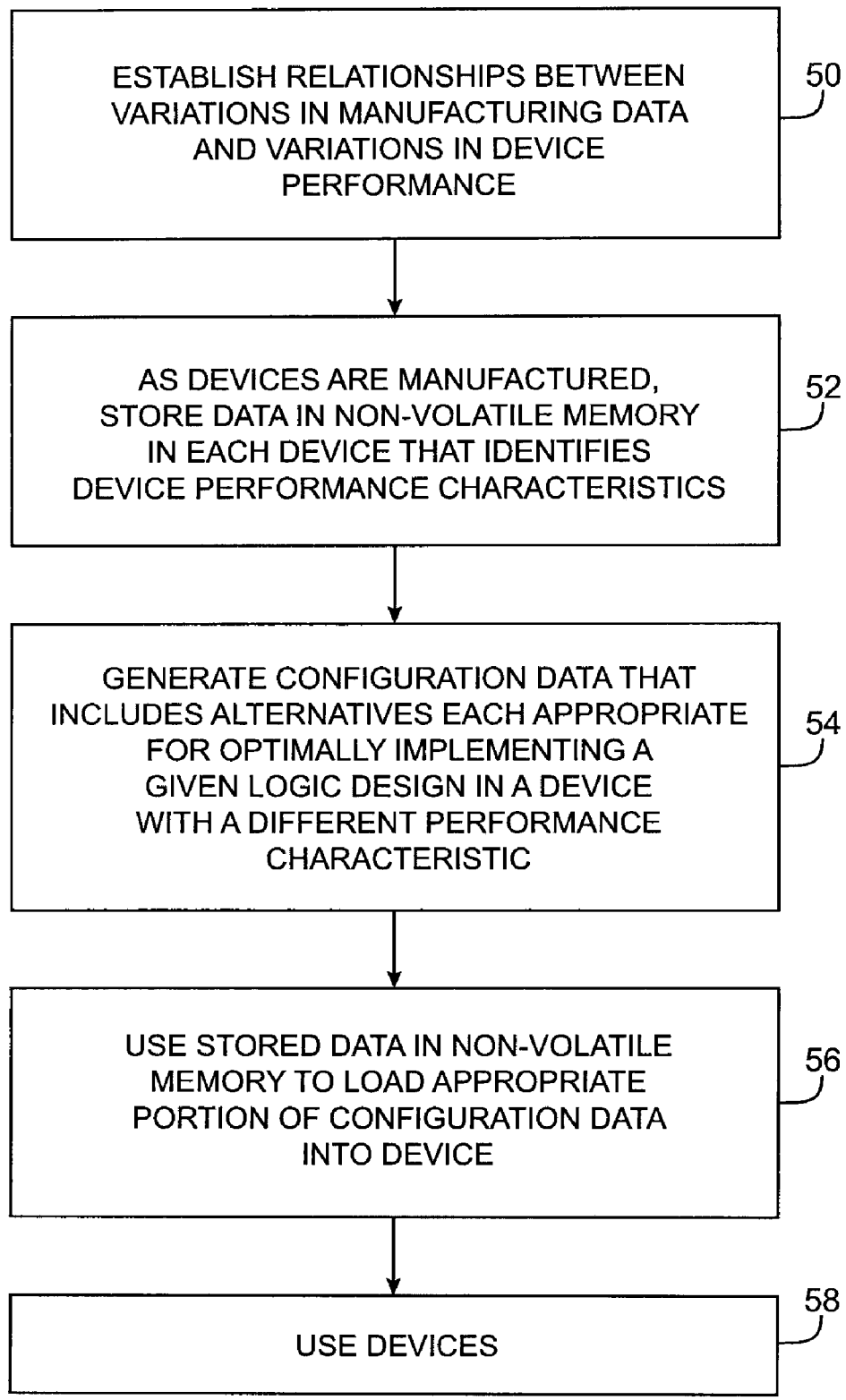
FIG. 7 is a flow chart of illustrative steps involved in producing and using programmable logic device integrated circuits with improved performance tolerances in accordance with the present invention.

Illustrative steps involved in manufacturing, programming, and using programmable logic devices in accordance with the present invention are shown in FIG. 7. At step 50, characterization operations are performed. With one suitable approach, early or test versions of the programmable logic device are tested. Testing may be performed at the wafer level and may be performed using packaged and unpackaged die. Wafer-level testing may involve measurements of test devices such as test transistors and diodes that are placed in scribe line locations on the wafer. Parametric manufacturing test results from scribe line test devices can be correlated with bench test results.

The characterization operations of step 50 are used to establish relationships between manufacturing variations that are due to variations in semiconductor fabrication and performance variations that affect the way in which circuitry on the programmable logic devices will perform when used in a system. For example, the characterization operations of step 50 may determine that whenever a wafer of programmable logic device integrated circuits contains n-channel metal-oxide-semiconductor transistors with a particular saturation current, the programmable logic devices that are produced from that wafer will have buffers with weak drive strengths relative to typical programmable logic devices. The results of the operations of step 50 may be stored in a database.

During a normal production run, the results from step 50 may be used in characterizing programmable logic devices (step 52). As devices are manufactured, measurements are made (e.g., at the wafer level and/or on packaged and unpackaged die that have been produced from a wafer). Using these measurements and the characterization information stored in the database from step 50, a manufacturer can determine how each programmable logic device that is produced will perform. Devices are labeled accordingly. With one suitable scheme, devices with different performance characteristics are tagged with bin codes or other suitable information that is stored in non-volatile memory 22. Fast devices, for example, can be labeled with a bin code suitable for fast devices. Slow devices can be labeled with a bin code for slow devices. If desired, bin codes can describe multiple attributes. For example, one bin code (or other data) may be used to label a device that is fast, has high currents, and low voltages. Another bin code may be used to identify devices that are fast, and have low currents and high voltages, etc.

At step 54, configuration data is generated to implement a logic designer's logic design. In a typical scenario, the logic designer uses computer-aided-design (CAD) tools running on a computer-based logic design system to generate the configuration data. The CAD tools have access to the information in the database created at step 50, so the CAD tools create configuration data that includes alternative configuration memory settings. Each alternative configuration memory setting is appropriate for use in programmable logic devices of a different bin code.

For example, if there are two types of programmable logic devices being manufactured (e.g., fast and slow), there could be two bin codes (fast and slow) and two corresponding alternative configuration memory settings (fast and slow). The fast configuration memory settings could be used to program one or more variable delay elements or other suitable circuit components when the logic designer's design is implemented in the fast programmable logic devices. The slow alternative configuration memory settings could be used to program one or more variable delay elements or other suitable circuit components when the design is implemented in the slow programmable logic devices.

During step 56, the programmable logic devices are programmed by loading configuration data into their configuration memory. Devices can be programmed using any suitable arrangement (e.g., a programmer, separate memory and loading chips, combined memory and loading circuits which are sometimes referred to as configuration devices, etc.). During loading, the bin code in each programmable logic device is retrieved and examined. The bin code (or other suitable performance characteristic labeling data) indicates the performance characteristics of the device that is being programmed. Using this information, the appropriate subset of the configuration data is loaded into the configuration memory to program the programmable logic device. In the present example, there are two types of devices (fast and slow), so after it is determined whether the device that is being programmed is fast or slow, appropriate configuration data is loaded that is optimized for use in fast or slow devices, as appropriate.

At step 58, the programmed devices can be used in a system. In general, the programmed devices can be used in any suitable type of system, such as a general purpose computer or an embedded system such as a board in a television or other piece of electronic hardware. Because customized configuration data has been loaded into each programmable logic device based on its performance characteristics, the performance specifications applicable to the device (i.e., to both the fast and slow versions of the device in this example) can be improved. The differences in the performance characteristics of the devices is generally kept secret from the users of the device. For example, both "fast" and "slow" versions of the device are generally sold under the same product name. There are generally no changes in the outward appearances of the devices to indicate their performance characteristics. Only the different bin codes stored in each device's non-volatile memory 22 can be used to reveal their performance differences. Product yield remains high, while performance tolerances are narrowed.

Figure 8:
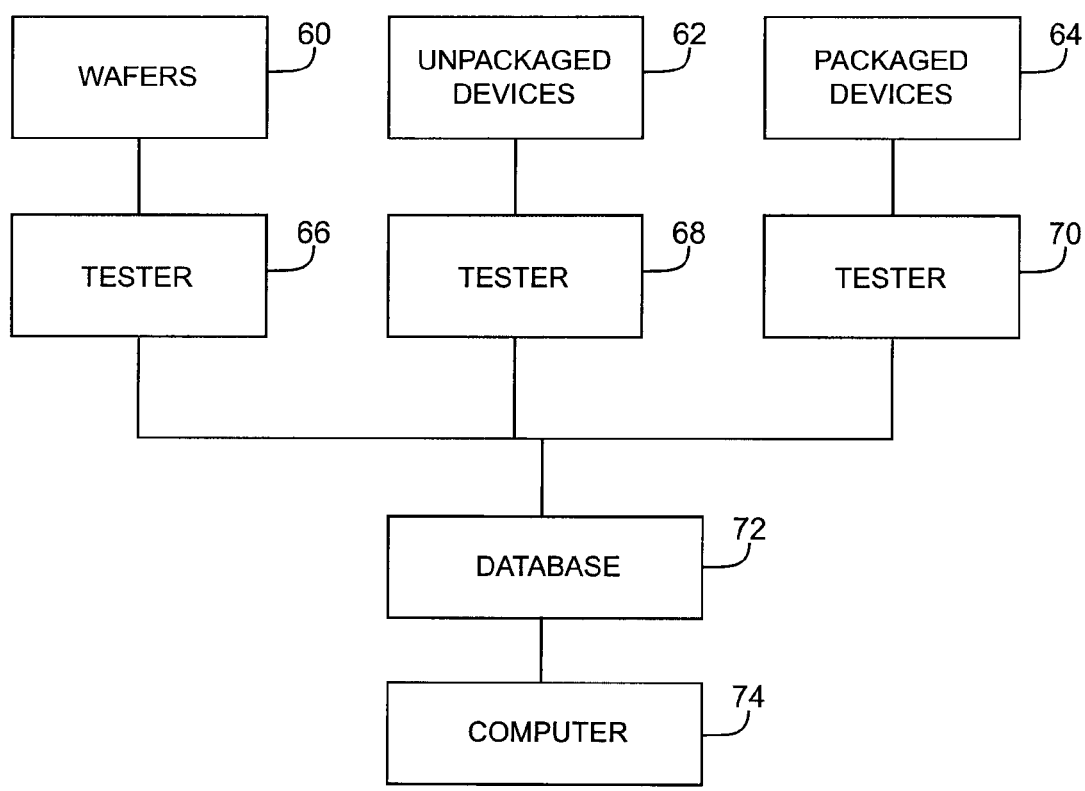
FIG. 8 is a diagram of an illustrative system environment in which testing is performed to characterize performance variations due to manufacturing variations for programmable logic devices in accordance with the present invention.
Figure 9:
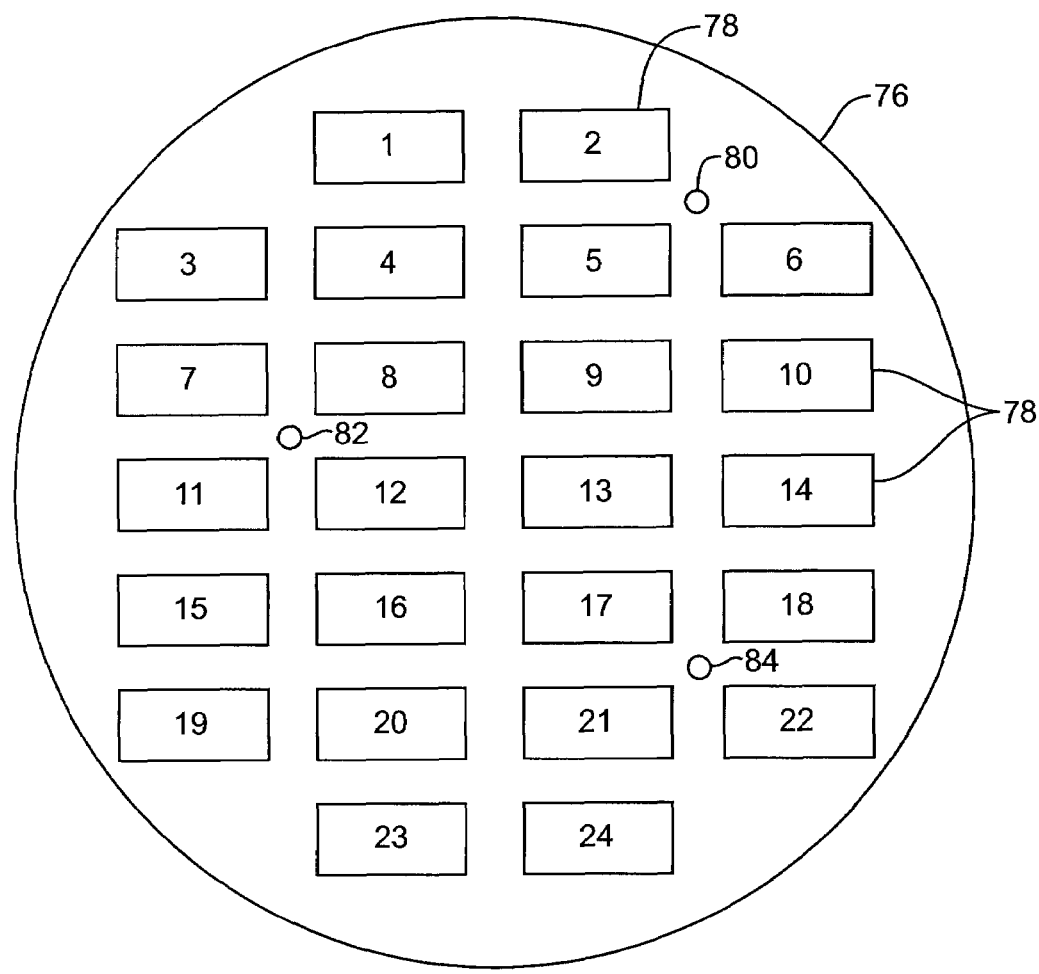
FIG. 9 is a top view of an illustrative silicon wafer containing multiple programmable logic device integrated circuit die and scribe line test devices whose performance can be measured to characterize programmable logic device integrated circuit performance variations due to manufacturing variations in accordance with the present invention.

An illustrative programmable logic device characterization system that may be used during step 50 is shown in FIG. 8. The system of FIG. 8 can be used to test wafers 60 of programmable logic devices, unpackaged programmable logic devices 62, and packaged devices 64. Tester 66 may include probe heads appropriate for probing programmable logic device integrated circuit pads on wafers 60. Tester 66 may also have probe heads that are used to probe test devices on wafers 60 that are not part of the die on the wafer. An illustrative wafer 76 is shown in FIG. 9. As shown in FIG. 9, wafer 76 may include a number of partially-formed or complete programmable logic device integrated circuits 78. Test devices 80, 82, and 84 may be located in the interstitial spaces between devices 78. There are three devices 80, 82, and 84 shown in the example of FIG. 9, but in general there may be any suitable number of devices. The interstitial locations of devices 80, 82, and 84 are sometimes referred to as scribe-line locations, because the gaps between circuits on a wafer are sometimes used for forming scribe lines to facilitate dicing of the wafer. Scribe line test devices such as devices 80, 82, and 84 may include n-channel and p-channel metal-oxide-semiconductor transistors, diodes, and other devices. These devices can be tested without involving devices 78.

During wafer measurements with tester 66 (FIG. 9), information may be gathered from scribe line devices such as devices 80, 82, and 84. The measurements from these devices may be averaged to form a wafer average or may be used independently. When the measurements are used independently, the measurements can be correlated with particular circuits on the wafer. For example, the measurements made on test devices 80 may be associated with the performance characteristics of programmable logic devices 2, 5, and 6 of FIG. 9.

Tester 68 of FIG. 8 may be used to make measurements on unpackaged devices (e.g., a room temperature).

Packaged devices (e.g., packaged devices at room temperature, an elevated temperature such as 85 C, or a lower temperature such as 0 C or −40 C) may be tested using tester 70 of FIG. 8.

Testers such as testers 66, 68, and 70 can contain probe heads and fixtures for forming electrical connections to the programmable logic devices under test. A typical measurement that might be performed by testers 66, 68, and 70 is a logic test in which test vectors are applied to circuit inputs and resulting output signals are measured at circuit outputs. Scan testing may also be performed. Timing tests may be performed by measuring the minimum delay associated with propagating a digital signal from one register to another (so-called register-to-register testing).

The results of the tests performed by testers 66, 68, and 70 may be stored in database 72. A computer system 74 may be used to process the collected manufacturing measurements.

Figure 10:
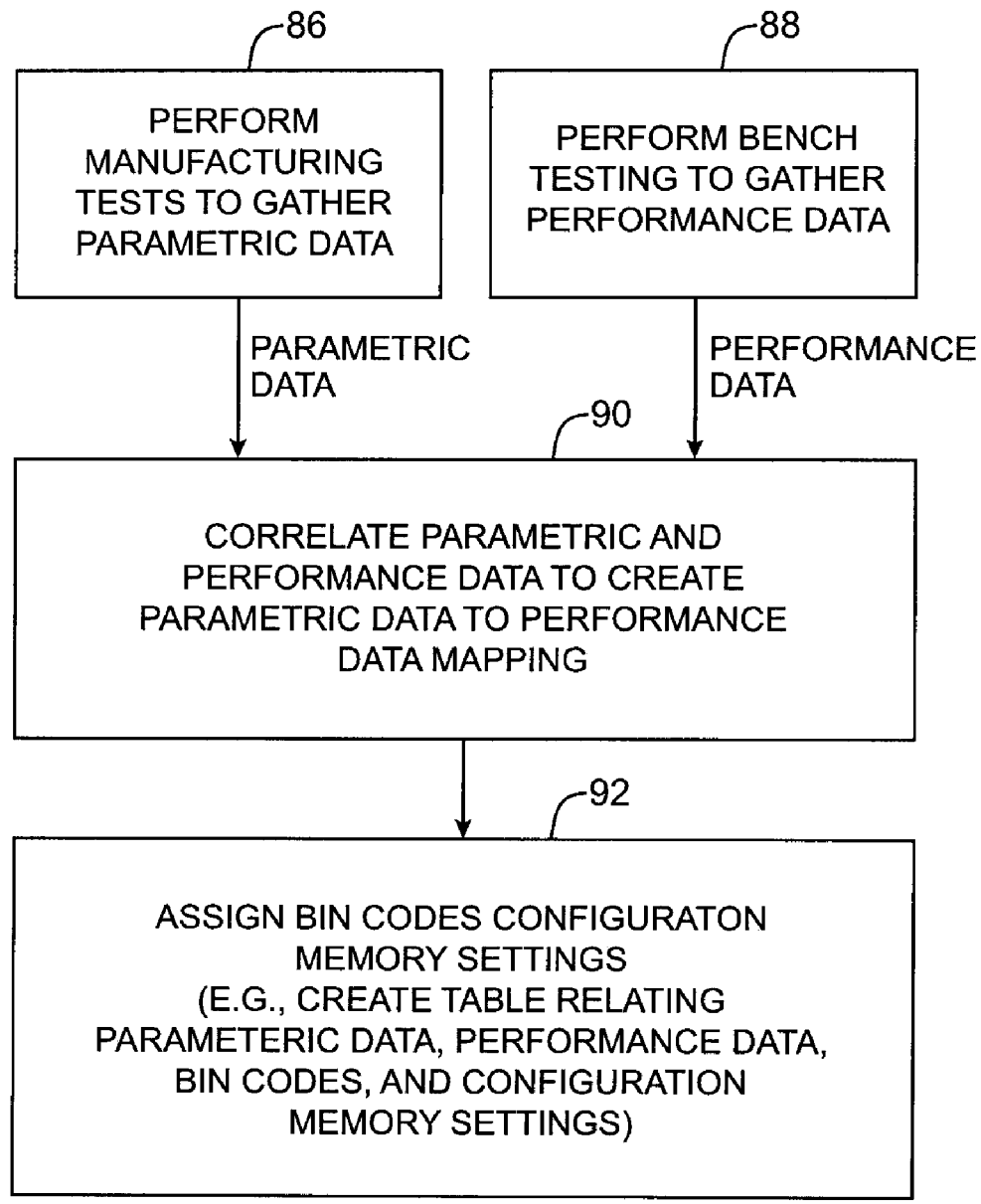
FIG. 10 is a flow chart of illustrative steps involved in characterizing the relationship between programmable logic device integrated circuit performance variations and underlying manufacturing variations in accordance with the present invention.

Illustrative steps involved in using the equipment of FIG. 8 to characterize programmable logic devices are shown in FIG. 10.

At step 88, a system such as the system of FIG. 8 is used to gather parametric data. Parametric data may, as an example, be gathered by measuring the characteristics of scribe line devices such as devices 80, 82, and 84 of FIG. 9. Typical results might include, polysilicon (gate) width, n-channel and p-channel transistor saturation currents, threshold voltages, device resistances, currents, and voltages, etc. Parametric data is a form of low-level or "raw" data indicative of the influence of semiconductor fabrication variations.

Figure 11:
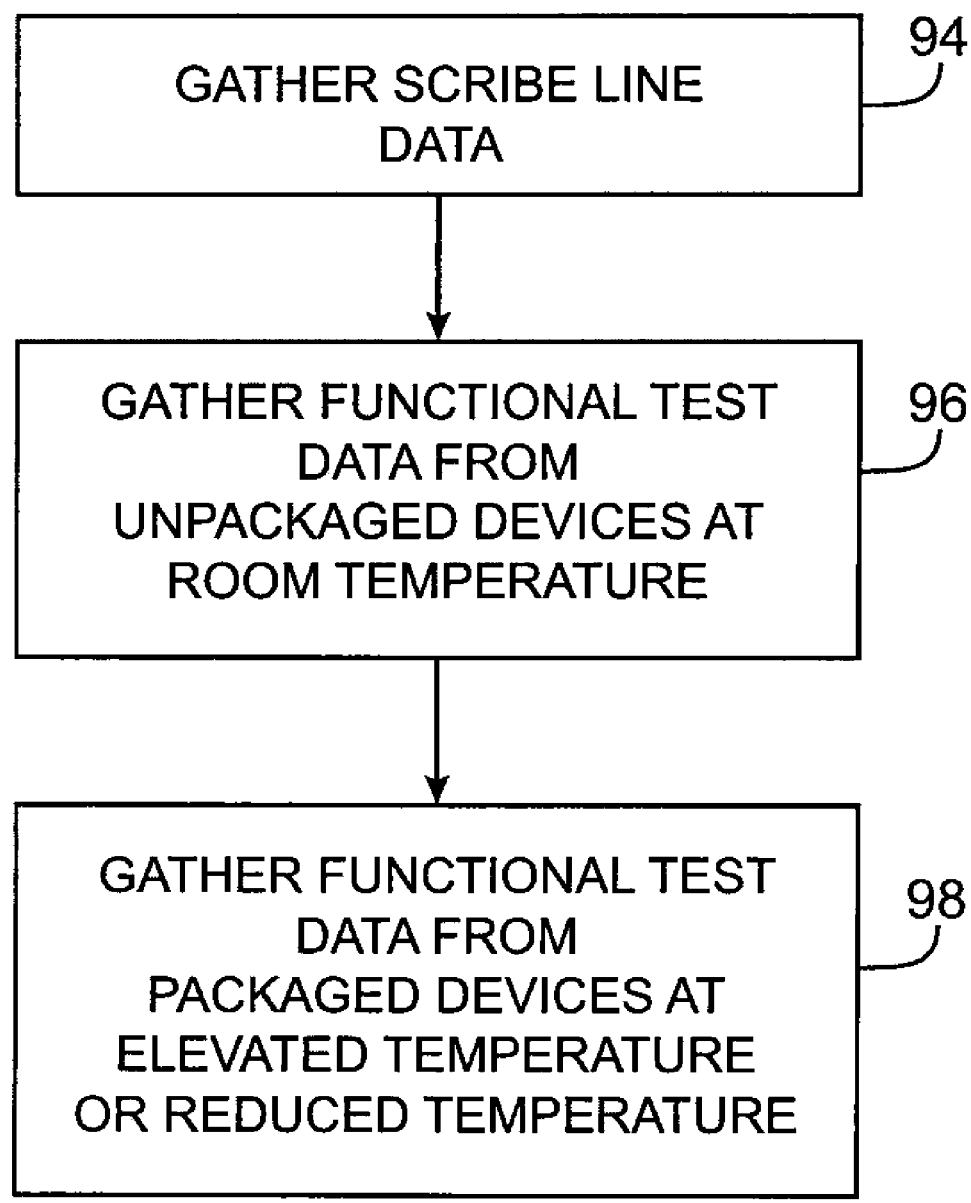
FIG. 11 is a flow chart of illustrative steps involved in gathering data during manufacturing testing of programmable logic devices in accordance with the present invention.

Any suitable technique may be used to perform the operations of step 88. One suitable approach is shown in FIG. 11. At step 94 of FIG. 11, scribe line data is gathered. Scribe line data may be gathered using tester 66 of FIG. 8.

At step 96, functional test data may be gathered from wafers 60 or unpackaged devices 62 at room temperature. In a typical arrangement, a tester such as tester 66 or 68 of FIG. 8 may be used to apply test vectors to wafers 60 or unpackaged devices 62 though a probe head and may be used to gather resulting output signals.

At step 98, a tester such as tester 70 may be used to perform functional testing on packaged devices 64 at elevated temperatures and/or reduced temperatures. A test fixture that allows the packaged integrated circuit to be electrically probed may be used by tester 70 to apply test signals and measure results. Typical functional test results indicate whether circuitry is performing properly under a variety of clock speed conditions.

As shown in FIG. 10, bench testing operations may be performed at step 88 to generate performance data for the programmable logic devices. Typical bench tests are performed over a range of temperatures on packaged devices to ensure that the devices perform satisfactorily. The results from the bench tests are higher-level ("performance") test results such as delay time (speed) results, buffer drive current results, etc. The performance results from step 88 correspond to performance variations in circuit elements in the programmable logic devices that can be compensated during programming (e.g., by adjusting a variable delay element or by setting a programmable drive current appropriately, etc.).

At step 90, computing equipment such as computer 74 of FIG. 8 may process the parametric and performance data to characterize the programmable logic device model that is being produced. Any suitable statistical modeling approach may be used during step 90. The results of the analysis of step 90 may be stored in a database (e.g., database 72). These results form a mapping between parametric and performance data. The mapping may be stored in the form of a table or other suitable data structure in the database. The mapping information can be used during subsequent manufacturing operations to avoid the need for extensive characterization operations.

For example, if the correlation results of step 90 indicate that all wafers with low transistor saturation currents are associated with weak output drivers, future devices can be characterized during manufacturing at step 92 by making saturation current measurements at the wafer level without any need to make device-level measurements on packaged devices. During step 92, different classes of devices are created and corresponding bin codes are assigned. If, for example, it is determined that the devices that are being manufactured fall into typical, fast, and slow categories, three bin codes can be assigned, each of which corresponds to a version of the device with different performance characteristics. Using knowledge of the device's circuit attributes, the logic design system CAD tools or other suitable tools generate appropriate alternative configuration memory settings for each bin code. These settings may be stored in database 72.

With one suitable approach, the operations of step 92 are used to create a table (or group of tables) that relate parametric data, performance data, bin codes, and alternative configuration memory settings. This type of table is sometimes referred to as a bin code table (see, e.g., the table of FIG. 6).

Consider, as an example, the bin code table of FIG. 12. In this example, the programmable logic device that is being manufactured has been categorized using three bins. Due to variations in the semiconductor fabrication process used to fabricate the device, some parts have transistors with a saturation current $I_{SAT}$ of 6 mA. Other parts have transistors with saturation currents $I_{SAT}$ of 7 mA and 8 mA. During step 92 of FIG. 10, three performance categories were created (e.g., low current, medium current, and high current). Bin codes of 00, 01, and 10 were assigned to the low current, medium current, and high current categories, respectively.

The CAD tools generated four alternative configuration memory settings. These configuration memory settings are labeled CM=00, CM=01, CM=10, and CM=11 in the table of FIG. 12. These are two-bit configuration memory setting examples which may be used, as an example, to program bits such as bits 44 of driver 42 in FIG. 3. In an typical device, there may be numerous configuration bits associated with each alternate setting and numerous programmable circuit components on a programmable logic device may be adjusted (e.g., numerous variable delay elements, numerous buffers, etc.)

The entries in the bin code table of FIG. 12 show what buffer drive currents will be produced for each device. For example, the buffers on a high-current (bin code 10) programmable logic devices with a configuration memory setting of 11 will produce 10 mA of current, as shown by the last column and last row of the table.

Using the information in the bin code table of FIG. 12, fabrication-induced variations can be compensated. Consider an example in which a logic designer desires to program circuitry on a programmable logic device to form a driver having a current strength of 14 mA. The logic designer has selected an appropriate model of programmable logic device in which to implement the circuit and has ordered 10,000 units of the device. Because of manufacturing variations, 3,000 of the devices will be bin 00 devices, 4000 of the devices will be bin 01 devices, and 3000 of the devices will be bin 10 devices. As the devices are programmed, the configuration logic selects between the appropriate alternative configuration memory settings. When a bin 00 device is being programmed, the desired design is implemented by loading a CM setting of 00. As shown in the first row and third column of the table of FIG. 12, this results in a driver current strength of 14 mA, as desired by the designer. When a bin 01 device is programmed, a CM setting of 01 is used, which causes the bin 01 device's driver to produce a current of 14 mA as desired (see the second row, fourth column of the table). The bin 10 devices are programmed using the alternative configuration memory bits 10, which causes their drivers to produce 14 mA currents, as indicated in the fifth column and third row of the table. As this example demonstrates, the desired circuit attribute (e.g., 14 mA of drive strength) is achieved within a tolerance of +/−0 mA, despite the presence of fabrication-induced variations across the 10,000 parts ordered by the logic designer.

Figure 13:
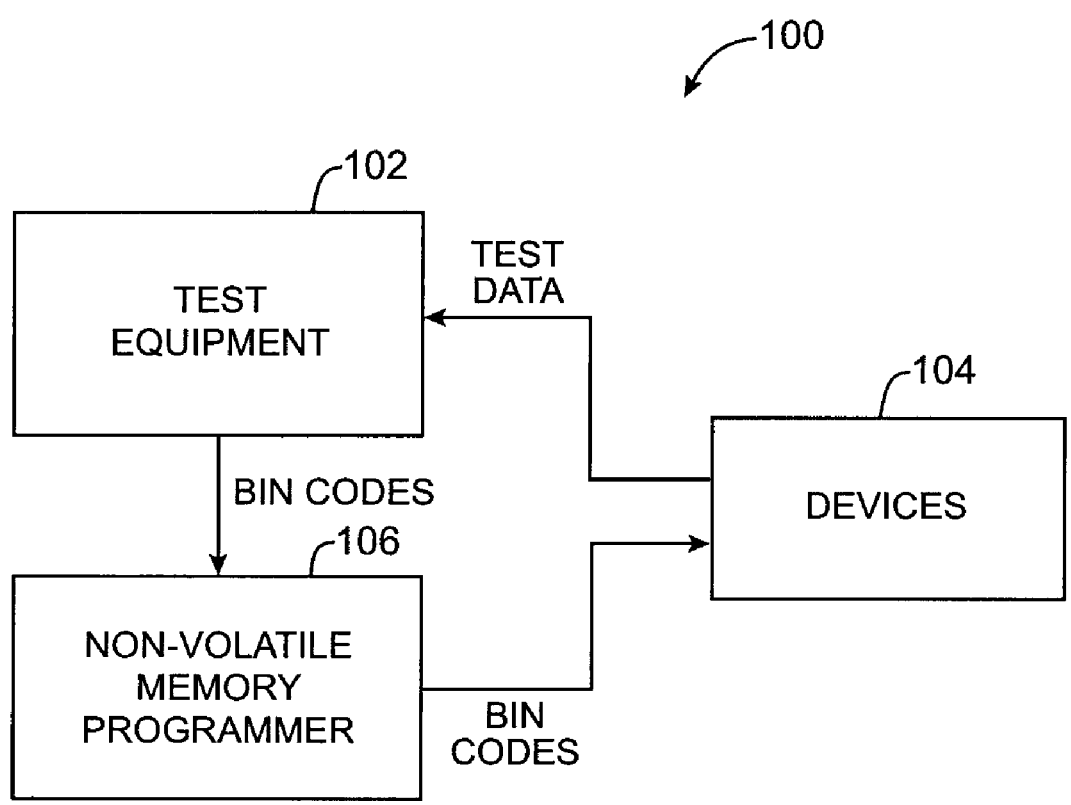
FIG. 13 is a diagram showing a manufacturing system in which programmable logic devices can be tested and tagged with appropriate bin codes in accordance with the present invention.

During step 52 of FIG. 7, programmable logic devices are labeled with information identifying their performance characteristics. With one suitable arrangement, equipment 100 of the type shown in FIG. 13 may be used during manufacturing. Test equipment 102 gathers parametric and/or bench test data from programmable logic devices 104. Test equipment 102 may include one or more testers that perform wafer-level testing and/or testing on unpackaged and/or packaged individual programmable logic device integrated circuits. Test equipment 102 typically includes probe heads for probing wafers and unpackaged devices and includes sockets or other test fixtures for testing packaged integrated circuits. The test equipment 102 may access a database such as database 72 of FIG. 8 over a network connection. Based on the information in database 72 such as the information in the bin code tables of FIGS. 6 and 12, the tester can categorize each device 104 and determine its bin code.

Test equipment 102 may communicate with other manufacturing equipment such as non-volatile memory programmer 106 over a communications path. Non-volatile memory programmer 106 may be any suitable programming equipment that is suitable for storing data in non-volatile memory 22 (FIG. 1). The type of programming arrangement that is used depends on the type of non-volatile memory being used. If, for example, memory 22 is based on laser-programmed links, programmer 106 includes lasers that program the links. If, as another example, memory 22 is based on electrically-programmable read-only-memory (EPROM) transistors or flash transistors, non-volatile memory programmer 106 includes circuitry for applying high voltages to program the transistors. The test equipment 102 preferably informs non-volatile memory programmer 106 of the bin code for each device 104. Using this information, non-volatile memory programmer 106 stores appropriate bin codes in each device 104.

Figure 14:
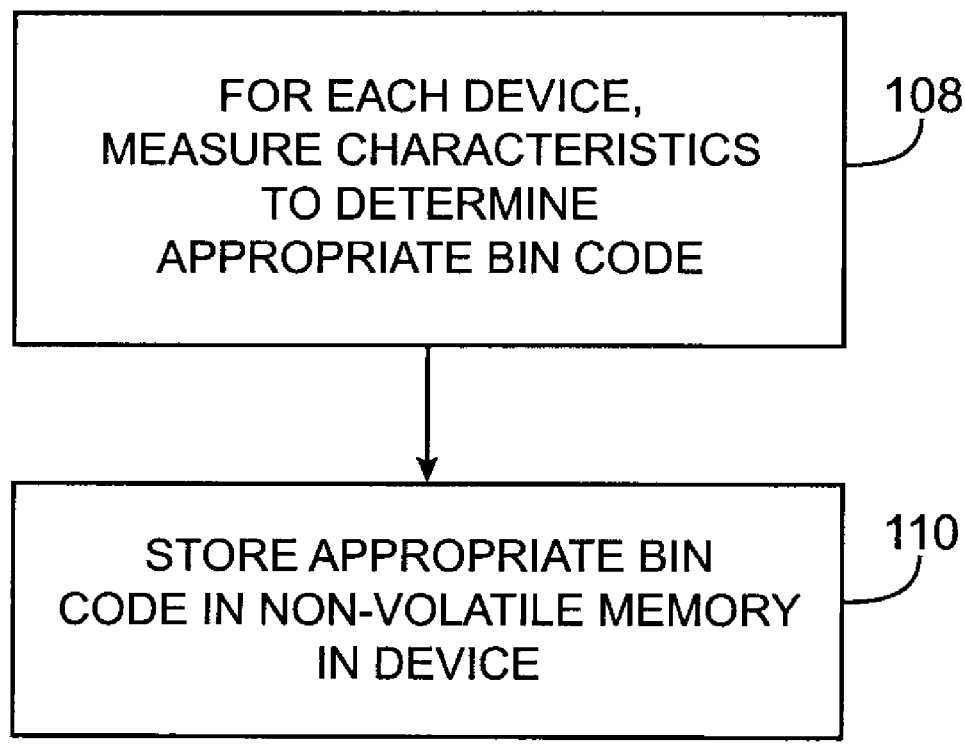
FIG. 14 is a flow chart of illustrative steps involved in tagging programmable logic devices that have been manufactured with bin codes or other information that is indicative of their performance characteristics in accordance with the present invention.

Illustrative steps involved in programming bin codes into programmable logic devices in accordance with the invention are shown in FIG. 14. The operations of FIG. 14 may be performed using equipment of the type shown in FIG. 13.

At step 108, the test equipment characterizes each programmable logic device. Multiple devices can be characterized at the same time by taking wafer-level measurements. For example, parametric data may be collected on scribe-line test devices as described in connection with FIG. 11. Scribe-line data from multiple wafer locations may be averaged and the entire wafer of devices categorized accordingly or location-specific categorization operations may be performed. If desired, performance data may be gathered during step 108. For example, a tester may be used to make register-to-register timing measurements to characterize a device's delay times (speed). These measurements may part of the functional tests performed of the programmable logic devices to determine, for example, whether redundant circuitry needs to be switched into place.

If the semiconductor fabrication process that is being used to fabricate the programmable logic devices is well controlled and if the characterization operations performed at step 50 of FIG. 7 are sufficiently detailed, it may be possible to perform relatively few characterization measurements during step 108 of FIG. 14. As an example, it may be possible with certain fabrication processes to measure parametric data on a sampling of wafers in a given production lot. These measurements may then be used to characterize the entire lot.

After the test equipment makes measurements on the programmable logic devices, the test equipment compares the measurements made to a database such as database 72 of FIG. 8. Database 72 contains characterization results such as the bin code tables of FIGS. 6 and 12, which were produced during step 50 of FIG. 7. The bin code table in database 72 forms a mapping between measured device characteristics (measured parametric and performance data) and bin codes. The mapping is used by the test equipment 102 (FIG. 13) during step 108 of FIG. 14 to determine each programmable logic device's appropriate bin code.

At step 110, each programmable logic device is labeled with its appropriate bin code. During step 110, non-volatile memory programmer 106 stores the appropriate bin code in the non-volatile memory 22 of each device. This serves to label each device according to its performance characteristics. For example, fast devices are labeled with a bin code identifying them as fast devices, slow devices are labeled with a bin code identifying them as slow devices, etc. Even though the bin codes stored in different groups of devices are different, all of the devices involved in this process are of the same type (i.e., they share the same product name).

To take advantage of the bin code labeling scheme, the computer-aided-design (CAD) tools that are used to generate configuration data for programming the programmable logic devices preferably create multiple bin-code-specific sets of programming data, each of which is appropriate for optimally programming a programmable logic device with a different bin code. The multiple sets of data may be provided in any suitable form. With one suitable approach, CAD tools generate a configuration data file that contains multiple alternative configuration memory settings. Each of the alternative configuration memory settings corresponds to a different one of the bin codes.

Figure 15:
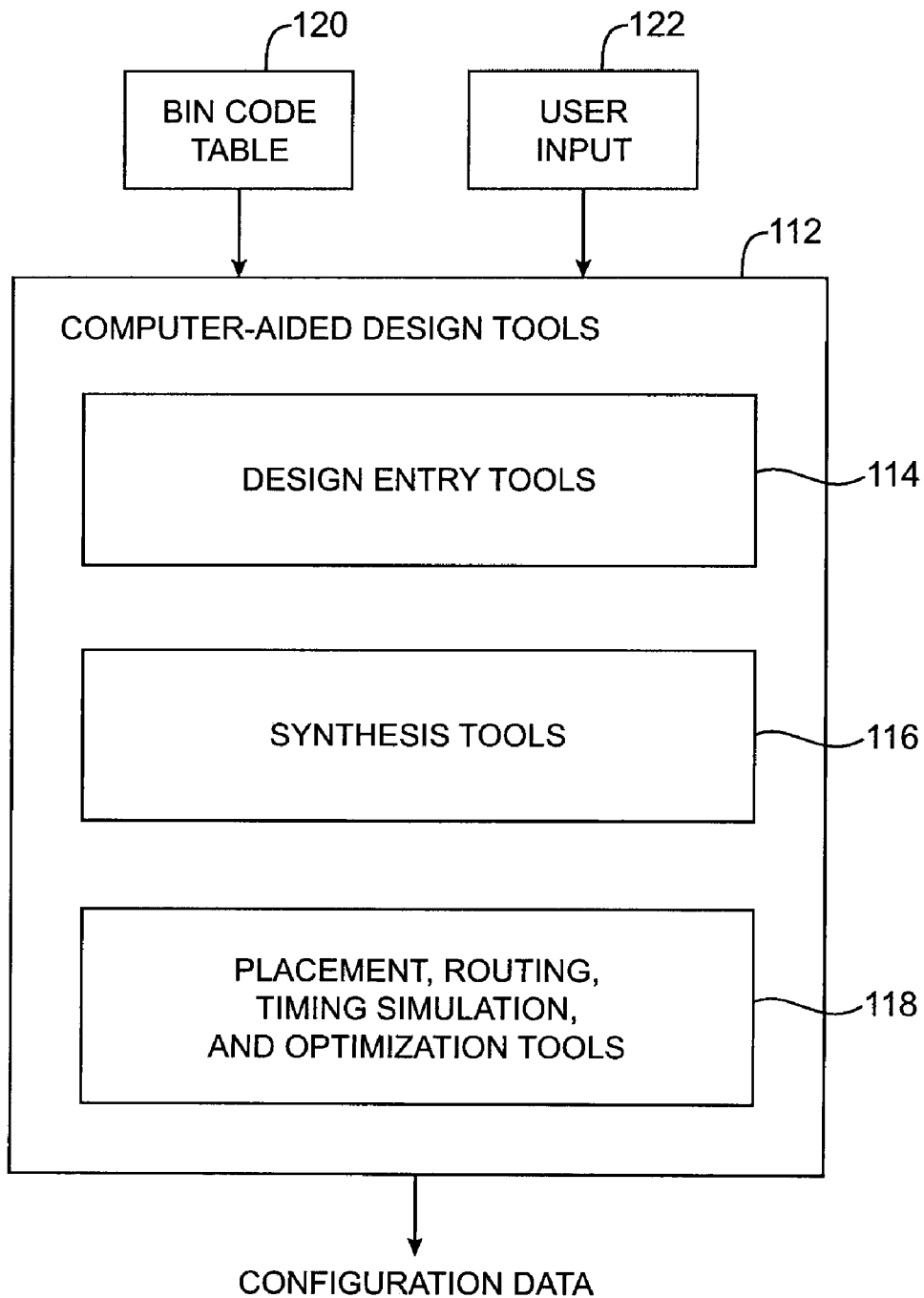
FIG. 15 is a diagram of computer-aided design tools that create configuration data for programmable logic devices in accordance with the present invention.

An illustrative logic design system that may be used to generate configuration data including multiple alternative configuration memory settings is shown in FIG. 15. The logic design system of FIG. 15 uses computer-aided design tools to help a logic designer design and test complex circuits for a system. The tools may be implemented on a computer or a networked-computer system. When a design is complete, the logic design system may be used to generate configuration data for electrically programming a programmable logic device.

The testing, manufacturing, and design equipment described herein such as the logic design system of FIG. 15 includes computing equipment with storage. Software such as the CAD software of FIG. 15 is used to implement the functions of this equipment. The software (code) may be stored on a computer-readable medium (storage). The storage in the equipment may include computer memory chips, removable and fixed media such as hard disk drives, flash memory, compact discs (CDs), DVDs, and floppy diskettes, tapes, or any other suitable memory or storage device(s). When the software is installed in the testing, manufacturing, and design equipment, the storage receives instructions and data that cause the computing equipment to execute various methods (processes), as described in connection with the accompanying flow charts.

Tools such as tools 112 produce configuration data for electrically programming the programmable logic device 10 from a set of design specifications or other suitable user input 122. Tools 112 may interact with databases such as database 72 of FIG. 8. For example, tools 112 can obtain information from a bin code table 120 such as the bin code tables of FIGS. 6 and 12.

The design process typically starts with the formulation of logic circuit functional specifications. A logic designer can specify how a desired circuit should function using design entry tools 114. Design entry tools 114 may include design entry aids and design editors. Design entry aids help a logic designer locate a desired design from a library of existing logic designs and may provide computer-aided assistance to the logic designer for entering (specifying) the desired design. A design editor may be used to enter a design (e.g., by entering lines of hardware description language code), may be used to edit a design obtained from a library (e.g., using a design entry aid), or may assist a user in selecting and editing appropriate prepackaged code/designs.

Design entry tools 114 can support a variety of design entry formats. For example, design entry tools 114 may include tools that allow the logic designer to enter a logic design using truth tables. Truth tables can be specified using text files or timing diagrams and may be imported from a library. Truth table logic design entry may be used for a portion of a large circuit or for an entire circuit.

As another example, design entry tools 114 may include a schematic capture tool. A schematic capture tool may allow the logic designer to visually construct logic circuits from constituent parts such as logic gates and groups of logic gates. Libraries of preexisting logic circuits may be used to allow a desired portion of a design to be imported with the schematic capture tools.

If desired, design entry tools 114 may allow the logic designer to provide a logic design to tools 112 using a hardware description language such as Verilog HDL or VHDL (Very High Speed Integrated Circuit Hardware Description Language). The logic designer can enter the logic design by writing hardware description language code with a design editor. Blocks of code may be imported from libraries if desired.

Using tools 114, a logic designer (e.g., an individual or a team) can provide information on desired constraints for the design. For example, the designer can provide information on timing constraints (e.g., maximum or minimum operating frequencies, latencies, etc.). The designer can also provide information on what types of optimization the designer desires tools 112 to perform (e.g., how the tools 112 should analyze the behavior of the programmable logic device design to estimate and evaluate timing conditions, etc.). User input of this type can also be provided later in the design flow (e.g., when interacting with synthesis tools 116 or tools 118).

After the design has been entered using design entry tools 114, synthesis tools 116 may be used to perform logic synthesis operations on the design. During synthesis, logic circuitry is generated by translating the truth-table, schematic, and/or hardware-description language design specifications into lower-level circuit descriptions. Tools 114 may include functional simulation tools that simulate the functional performance of the design. If the functional performance of the design is incomplete or incorrect, the logic designer can make changes to the design using design entry tools 114. Once the functional operation of the logic design has been determined to be satisfactory, synthesis tool 116 may be used to implement the logic design in a particular programmable logic device and device technology During this process, which is sometimes called "technology mapping", a netlist representation of the logic design is translated into a representation of the design that is specific to the logic and interconnect resources of a particular programmable logic device product or product family. Tools 116 can help ensure proper selection of available hardware to implement different logic functions in the logic design. Often tradeoffs are made because multiple logic functions are competing for limited resources.

After logic synthesis using tools 116, the logic design system may use tools such as placement and routing tools 118 to perform physical design steps (layout synthesis operations). Placement and routing tools 118 are used to determine how to place the circuits for each logic function within the programmable logic device. For example, if two counters interact with each other, the placement and routing tools 118 may locate these counters in adjacent logic regions on the programmable logic device to minimize interconnect delays. The placement and routing tools 118 create orderly and efficient implementations of logic designs for a given programmable logic device.

Tools 118 may analyze the performance of a given design using timing simulation algorithms. A timing simulation may, for example, be used to predict the delay times that are associated with certain signal paths through the device. Timing simulations may be used to verify that the particular implementation of the design that is being tested does not contain signal paths with delays that are outside of the limits imposed during the design phase. For example, the timing simulation algorithm may be used to ensure that the slowest data paths are fast enough that minimum desired clock speed and minimum signal path delay constraints are satisfied. The timing simulation algorithm may also examine the design for potential race conditions or other conditions that affect device performance.

When an implementation of the desired logic design has been sufficiently optimized, tools 112 output a configuration data file. During the use of tools 112 (e.g., synthesis tools 116), tools 112 consult the information in bin code table 120 (e.g., the performance-data-to-bin code mapping). CAD tools 112 determine how best to satisfy the logic designer's functional and performance constraints for programmable logic devices with each of the bin codes in the bin code table. For example, if the logic designer's design specifies that a particular buffer should have a drive strength of 14 mA, the CAD tools 112 use a table such as the bin code table of FIG. 12 in determining what configuration memory settings are required to implement this design in each of three categories of programmable logic device (bin code 00 devices, bin code 01 devices, and bin code 10 devices). In this example, the CAD tools 112 determine that the configuration memory settings for the programmable buffer 42 (FIG. 3) should be CM=00 for bin code 00 devices, CM=01 for bin code 01 devices, etc. The alternative configuration memory settings (the CMs) that are associated with each bin code can be included in the configuration data that is produced. In the simplified example of FIG. 12, each alternative configuration memory setting has two bits. In an actual complex circuit design, there may be tens, hundreds, thousands, or more than thousands of memory bits involved in each alternative.

Figure 16:
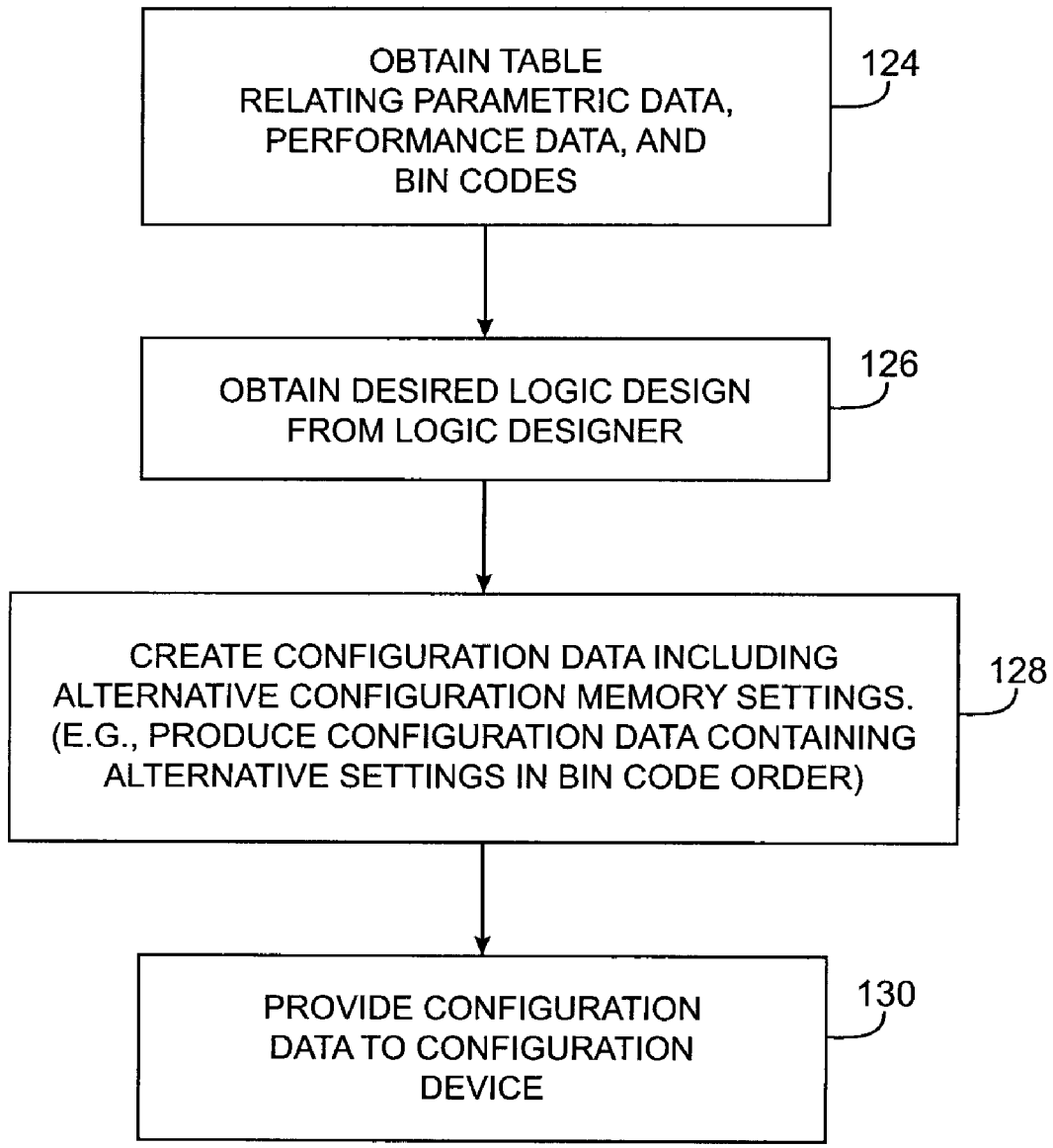
FIG. 16 is a flow chart of illustrative steps involved in generating programmable logic device integrated circuit configuration data with a logic design system in accordance with the present invention.

Illustrative steps involved in using CAD tools 112 of FIG. 15 to generate configuration data for device 10 are shown in FIG. 16.

At step 124, tools 112 obtain information relating performance data to bin codes. For example, tools 112 obtain the bin code table 120 of FIG. 15 from database 72 (FIG. 8). The bin code table 120 can include pre-computed alternative configuration memory settings or these settings can be computed by tools 112 for each new logic design based on the performance and bin code date.

At step 126, tools 112 obtain a desired logic design from a logic designer (e.g., user input 122 of FIG. 15).

At step 128, tools 112 create configuration data for implementing the desired logic design in a programmable logic device. The configuration data includes alternative configuration memory settings, each of which is appropriate for implementing the logic design in a programmable logic device with a different corresponding bin code. To ensure that the correct alternative configuration memory setting can be extracted from the configuration data when needed during subsequent programming operations, the CAD tools 112 can label the alternative configuration memory settings (e.g., with a code) or can place them is an alternative configuration memory settings file. With a preferred arrangement, the alternative configuration memory settings are placed in bin-code order in the configuration data file.

At step 130, the configuration data (e.g., the configuration data that includes the alternative configuration memory settings appropriate for each bin code in bin code order or any other suitable predefined order), is provided to a configuration device or other suitable circuit or equipment for use in programmable logic device programming operations.

Programmable logic devices can be programmed using computer-based equipment (e.g., test equipment, programmers, personal computers with supplemental hardware, etc.). Programmable logic devices can also be programmed by loading configuration data into a memory circuit or an integrated memory and loading circuit. Integrated memory and loading circuits are sometimes referred to as configuration devices and typically include non-volatile memory and control circuitry. The non-volatile memory is loaded with configuration data during manufacturing. At power-up (e.g., when a system in which the programmable logic device is being used receives power), the control circuitry in the configuration device transfers the data from the non-volatile memory to volatile memory in the programmable logic device (e.g., static-random-access-memory-based configuration elements 20).

In general, programmable logic devices may be loaded using any suitable technique. The use of a configuration device to provide configuration data to a programmable logic device during programming is described herein as an example.

Figure 17:
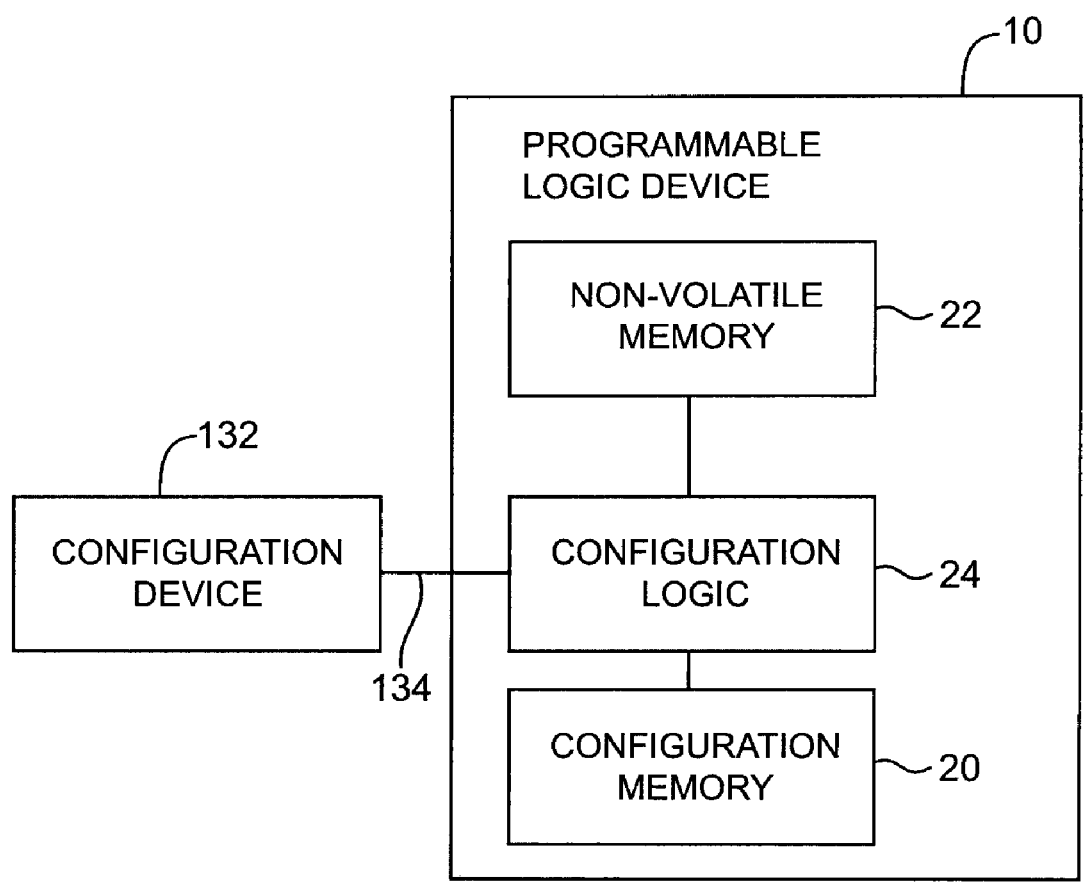
FIG. 17 is a diagram of an illustrative system in which a programmable logic device is programmed with configuration data in accordance with the present invention.

An illustrative system environment in which a configuration device 132 loads configuration data into a programmable logic device 10 in accordance with the invention is shown in FIG. 17. Device 132 obtains configuration data from CAD tools 112 (FIG. 15) during step 130 of FIG. 16 (e.g., by loading the configuration data into non-volatile memory in configuration device 132). Device 132 and device 10 are typically used in part of a larger system. For example, device 132 and device 10 may be mounted on a printed circuit board containing other integrated circuits. Device 132 and device 10 communicate over a communications path 134. When device 132 and device 10 are mounted on a circuit board, the path 134 is made up of conductive traces on the circuit board.

The programmable logic device 10 contains non-volatile memory 22, configuration logic 24, and configuration memory 20. During manufacturing, the performance of the programmable logic device is measured using test equipment and a corresponding bin code for the device is stored in non-volatile memory 22. During programming, the configuration logic 24 is provided with configuration data from configuration device 132. The configuration logic 24 uses the bin code data in non-volatile memory 22 in deciding which portions of the configuration data from configuration device 132 should be loaded into configuration memory 20.

Figure 18:
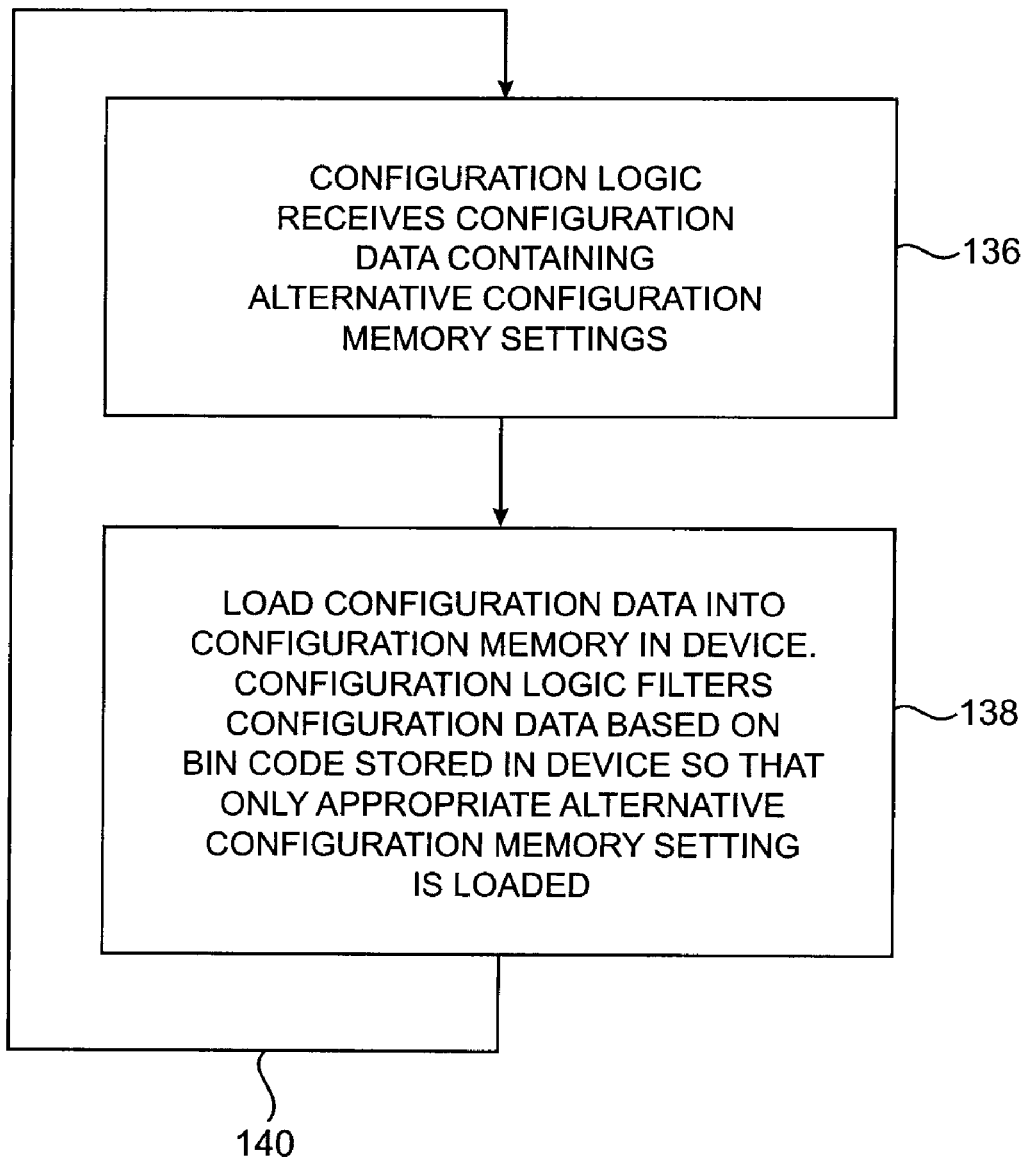
FIG. 18 is a flow chart of illustrative steps involved in programming a programmable logic device with configuration data in accordance with the present invention.

Illustrative steps involved in programming programmable logic device 10 with configuration data are shown in FIG. 18.

At step 136, the configuration logic 24 receives configuration data from configuration device 132 over path 134. The configuration data includes the alternative configuration memory settings produced by CAD tools 112 (FIG. 15).

At step 138, the configuration logic 24 loads the configuration data into configuration memory 20. If desired, loading may take place while configuration data is being received from configuration device 132, thereby reducing memory buffer requirements in configuration logic 24. During step 138, configuration logic 24 only stores configuration data in configuration memory 20 that is appropriate for the particular programmable logic device in which the configuration logic 24 and configuration memory 20 are contained. In particular, the configuration logic 24 uses the bin code information stored in non-volatile memory 22 to determine the performance characteristics of the device 10. The configuration logic 24 filters the received configuration data based on the bin code so that only the appropriate alternative configuration memory setting is loaded into configuration memory 20. As indicated by line 140, the process of FIG. 18 is repeated for each programmable logic device 10 that is being programmed. In each loop through steps 136 and 138, the bin code of the device that is being programmed is used to guide the configuration logic 24, so that only the optimal configuration data settings are used to program the device.

Figure 19:
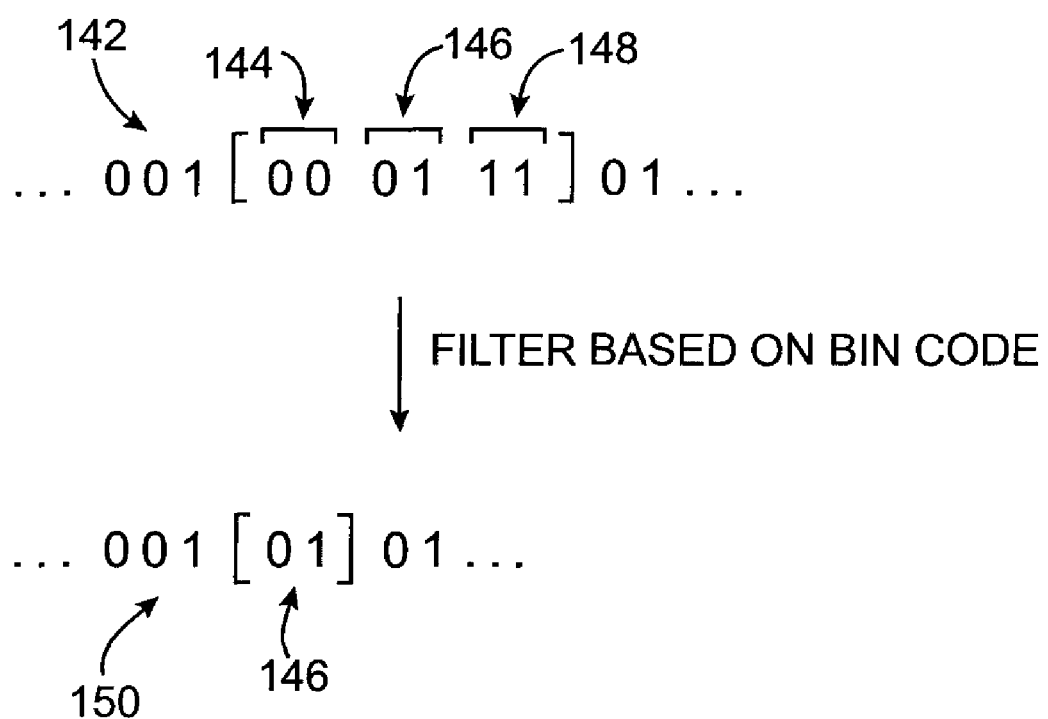
FIG. 19 is a diagram showing how configuration logic in a programmable logic device filters configuration data during programming in accordance with the present invention.

Any suitable technique may be used by configuration logic 24 to select the subset of the configuration data that is loaded into the configuration memory. An example is shown in FIG. 19. In the example of FIG. 19, a stream 142 of configuration data is received by configuration logic 24 from configuration device 132. The configuration data 142 contains three alternative configuration memory settings: alternative configuration memory setting 144, alternative configuration memory setting 146, and alternative configuration memory setting 148.

Configuration logic 24 uses the bin code in non-volatile memory to select the subset of data that is loaded. In particular, configuration logic 24 uses the bin code to select which of the alternative memory settings should be retained and loaded into the configuration memory 20 with the other portions of the configuration data. In the example of FIG. 19, the configuration logic 24 has determined from the bin code that the appropriate alternative configuration memory setting to be loaded is alternative configuration memory setting 146 (i.e., the configuration data bits "01"). As shown in the lower portion of FIG. 19, the stream 150 of configuration data that the configuration logic 24 loads into the configuration memory therefore contains only the alternative memory setting 146. Alternative memory settings 144 and 148 are discarded. With one suitable approach, the alternative memory settings 148, 146, and 144 are placed in the stream 142 in bin-code order, so that the configuration logic can filter the configuration data by counting the configuration bits that are received. Other filtering approaches may be used if desired.

The foregoing is merely illustrative of the principles of this invention and various modifications can be made by those skilled in the art without departing from the scope and spirit of the invention.

What is claimed is:

1. A method of programming programmable logic device integrated circuits that contain non-volatile memory and configuration memory, comprising:
   providing a set of configuration data for programming a given programmable logic device to implement a desired logic design, wherein the set of configuration data includes multiple alternative configuration memory settings each of which is optimized for programming programmable logic devices with different performance characteristics; and
   using information stored in the non-volatile memory of the given programmable logic device that is indicative of performance characteristics of the given programmable logic device to load a subset of the configuration data into the configuration memory of that given programmable logic device, wherein the subset is smaller than the set.

2. The method defined in claim 1 wherein providing the configuration data comprises using a configuration device to provide the configuration data to the programmable logic device over a communications path.

3. The method defined in claim 1 further comprising transmitting the set of configuration data including the multiple alternative configuration memory settings to the programmable logic device.

4. The method defined in claim 1 further comprising:
   transmitting the set of configuration data including the multiple alternative configuration memory settings to the programmable logic device; and
   at the programmable logic device, forming the subset of configuration data by discarding at least one of the alternative configuration memory settings.

5. The method defined in claim 1 further comprising:
   storing the set of configuration data with the alternative memory settings in non-volatile memory in a configuration device;
   transmitting the set of configuration data including the multiple alternative configuration memory settings to the programmable logic device from the configuration memory device over a conductive circuit board path; and
   at the programmable logic device, forming the subset of configuration data by discarding at least one of the alternative configuration memory settings.

6. The method defined in claim 1 further comprising:
   determining which performance characteristics are associated with each programmable logic device by performing tests during manufacturing; and
   storing a bin code in the non-volatile memory of each programmable logic device to specify which performance characteristics were determined to be associated with that programmable logic device.

7. The method defined in claim 1 further comprising:
   making parametric data measurements on wafers of programmable logic device integrated circuits; and
   using a bin code table and the parametric data measurements to determine which bin code corresponds to each programmable logic device, wherein using information on the given device comprises using a bin code stored in the non-volatile memory.

8. The method defined in claim 1 further comprising:
   making performance data measurements on packaged versions of the programmable logic devices; and
   determining which bin code corresponds to each packaged programmable logic device based at least partly on the performance data measurements.

9. A programmable logic device integrated circuit comprising:
   non-volatile memory containing information identifying performance characteristics of the programmable logic device;
   configuration logic that receives a set of configuration data with alternative configuration memory settings each of which is optimized for programming programmable logic devices with different performance characteristics;
   logic components; and
   configuration memory that provides static control signals that control the logic components, wherein the configuration logic filters the set of configuration data based on the information stored in the non-volatile memory to produce a subset of the configuration data, wherein the subset is smaller than the set, wherein the subset contains at least one retained alternative configuration memory setting, and wherein the subset of the configuration data is loaded into the configuration memory to configure the logic components.

10. The programmable logic device defined in claim 9 further comprising:
a programmable variable delay element that is programmed by the retained alternative configuration memory setting.

11. The programmable logic device defined in claim 9 further comprising a buffer having a programmable drive strength that is adjusted by loading the retained alternative configuration memory setting into an associated portion of the configuration memory.

12. The programmable logic device defined in claim 9 wherein the information identifying the performance characteristics of the programmable logic device comprises a bin code and wherein the configuration logic further comprises circuitry that forms the subset of the configuration data based on the bin code.

* * * * *

UNITED STATES PATENT AND TRADEMARK OFFICE
CERTIFICATE OF CORRECTION

PATENT NO.        : 7,644,385 B1                                         Page 1 of 1
APPLICATION NO.   : 11/269019
DATED             : January 5, 2010
INVENTOR(S)       : Boyle et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 937 days.

Signed and Sealed this

Twenty-first Day of December, 2010

David J. Kappos
*Director of the United States Patent and Trademark Office*